(12) United States Patent
Padullaparthi et al.

(10) Patent No.: US 10,910,791 B2
(45) Date of Patent: Feb. 2, 2021

(54) LOW SPECKLE LASER ARRAY AND IMAGE DISPLAY THEREOF

(71) Applicants: XIAMEN SANAN INTEGRATED CIRCUIT CO., LTD., Xiamen (CN); SANAN OPTOELECTRONICS HONG KONG COMPANY LIMITED, Queensway (HK)

(72) Inventors: Babu Dayal Padullaparthi, Queensway (HK); Pohan Chen, Xiamen (CN); Liqin Qiu, Xiamen (CN); Jiarui Fei, Xiamen (CN)

(73) Assignee: Xiamen Sanan Integrated Circuit Co., Ltd., Xiamen (CN)

( * ) Notice: Subject to any disclaimer, the term of this patent is extended or adjusted under 35 U.S.C. 154(b) by 0 days.

(21) Appl. No.: 16/451,277

(22) Filed: Jun. 25, 2019

(65) Prior Publication Data

US 2020/0006920 A1   Jan. 2, 2020

Related U.S. Application Data

(60) Provisional application No. 62/690,479, filed on Jun. 27, 2018.

(51) Int. Cl.
  *H01S 5/183* (2006.01)
  *G02B 27/48* (2006.01)

(52) U.S. Cl.
  CPC .......... *H01S 5/18361* (2013.01); *G02B 27/48* (2013.01); *H01S 5/18305* (2013.01); *H01S 5/18308* (2013.01); *H01S 5/18347* (2013.01)

(58) Field of Classification Search
  CPC ............. H01S 5/18361; H01S 5/18308; H01S 5/18305; H01S 5/18347; H01S 5/183; H01S 5/187; H01S 5/34313; H01S 5/423; H01S 2301/16; H01S 5/18394; H01S 5/18311; H01S 5/18352; H01S 2301/02; H01S 5/005; G02B 27/48
  See application file for complete search history.

(56) References Cited

U.S. PATENT DOCUMENTS

| | | | |
|---|---|---|---|
| 6,661,823 B1* | 12/2003 | Otoma | H01S 5/18391 372/49.01 |
| 2003/0013224 A1* | 1/2003 | Shimizu | B82Y 20/00 438/47 |
| 2010/0111125 A1* | 5/2010 | Kondo | H01S 5/1833 372/45.01 |
| 2015/0260830 A1* | 9/2015 | Ghosh | G01S 7/484 250/208.1 |
| 2018/0038944 A1* | 2/2018 | Hellmig | G01S 17/894 |

* cited by examiner

*Primary Examiner* — Xinning (Tom) Niu
(74) *Attorney, Agent, or Firm* — Rosenberg, Klein & Lee

(57) ABSTRACT

A vertical-cavity surface-emitting laser (VCSEL) device includes a substrate, first and second-type doped distributed Bragg reflectors, first and second electrodes, an active layer, a surface relief layer having a surface relief indentation of a diameter (d4) ranging from 1.0-6.0 um, and a confinement member defining an aperture with a diameter (d2) ranging from 3.0-15 μm. The second electrode is a ring-shaped p-contact metal having an inner diameter (d3) ranging from 8-17 μm. The VCSEL device has a mesa structure that has a bottom mesa diameter (d1) ranging from 16-28 μm. The diameters satisfy the relation of d1>d2>d3>d4. The surface relief layer has a thickness equaling to n/4 times a wavelength of a laser beam generated by the active layer with n being positive even numbers.

20 Claims, 20 Drawing Sheets

180-Vertical

180-Horizontal + 180-Vertical

LOW SPECKLE LASER ARRAY AND IMAGE DISPLAY THEREOF

CROSS-REFERENCE TO RELATED APPLICATION

This application claims the benefit of U.S. Provisional Patent Application No. 62/690,479, filed on Jun. 27, 2018, which is incorporated by reference herein in its entirety.

FIELD

The disclosure relates to a semiconductor laser device and an optical laser array thereof, and more particularly to a low speckle vertical-cavity surface-emitting laser (VCSEL) device and an optical laser array including a plurality of the low speckle VCSEL devices arrays that are randomly arranged.

BACKGROUND

There are wide applications in connection with vertical-cavity surface-emitting laser (VCSEL) devices, such as data communication, absorption spectroscopy, optical sensor, specially, 3D-sensing such as facial recognition (FR), gesture recognition (GR), etc.

In the past, the display technology has witnessed several light sources for projection systems such as lamps, light-emitting diodes (LEDs) and lasers. The performance of the projection system mainly depends on the performance of the light sources used. High intensity discharge (HID) lamps, and ultra high pressure (UHP) Mercury (Hg) lamps have short lifetime and requires warm-up time before their use in projection systems. Due to the lack of filament and catastrophic damage, brightness, fast switching times, and longer lifetimes (up to 20,000 hours), solid state emitters viz. display LEDs have been replacing traditional lamps. Again due to the lack of narrow emission angle and high brightness, and limits of the performance and lifetimes, LEDs have been replaced with lasers in high-output projection systems especially in microdisplays. The very narrow divergence of the lasers allows the use of projection lens with low cost and smaller size. Very high brightness (5×10^6 time that of LED) and longer lifetime (>50,000 hours) than LEDs facilitate the lasers to dominate the projection display market demands.

However, the use of the lasers is too limited by mainly its presense of speckle. Speckle emerges when at least partly coherent light is scattered from an optically rough surface and is scattered in a volume or propagates through a material with quasi-random fluctuations of refractive index. As shown in FIG. 1A, it is a consequence of high temporal and spatial coherence of property of the light that occurs due to interference of coherent laser light scattered from random phase delays in image plane such as projection screen and significantly degrades the image quality. For example FIGS. 1B and 1C show the images with and without speckle, respectively.

Speckle is quantified by the contrast of the quasi-random interference pattern, and the contrast of the speckle pattern C is given by $$C = \sigma_I / I \quad \text{(Equation-1)},$$

wherein $\sigma_I$ denotes the standard deviation of the intensity values and I denotes the mean intensity. C=1 for a fully developed speckle patterns (generated with sufficient rough surfaces which have Gaussian distributions) and C=0 for suppressed speckle generated with constant intensity. The reciprocal of C is called signal-to-noise ratio (S/N or SNR), which is an important parameter to define the quality of image on the projected screen. Therefore, the suppression of speckle is a great challenge in display technology.

So, it is desirable to develop a VCSEL device with low speckle contract ratio, and thereby increasing signal-to-noise ratio and increasing image quality in practical applications. Due to the high demand of VCSEL applications in 3D sensing (facial and gesture recognitions), VCSEL can be used as an ideal light source to produce low speckle.

Several attempts (FIGS. 2A to 2D) were made in the past to reduce speckle from VCSEL arrays. In this invention, inventors discloses new method to inherently reduce speckle directly by controlling the VCSEL epi-structure and chip (wafer)-process designs, try to avoid speckle control from costly external optics (lenses, filters, projection systems, etc). FIG. 3 shows a conventional oxide confined VCSEL device in top-anode and bottom-cathode configuration.

A Doctoral Thesis "Speckle Suppression in Laser Projection Displays" of the Buskerud and Vestfold University College by Trinh Thi Kim Tran discloses methods for speckle suppression in laser projection system. An approach proposed by the thesis includes the application of a MEMS diffuser that has random patterns, which is used as a wavefront phase modulator for speckle suppression. Another approach proposed by the thesis includes the use of a commercial phase-randomizing deformable mirror for speckle suppression. The mirror includes a continuous surface of micro mirror array that can be individually deformed and actuated up to hundreds of kHz. The thesis also proposes the integration of other speckle suppression such as wavelength diversity, angle diversity and moving diffuser with a real laser projection system.

Another thesis "Speckle Reduction in Projection Systems" of the Karlsruhe Institute of Technology by Falko Riechert also discloses methods for speckle reduction in laser projection applications. An approach proposed by the thesis includes the use of ray tracing software as a prediction of speckle phenomena in projection systems. The thesis also proposes another approach for speckle reduction utilizing depolarization and wavelength decorrelation in the screens under broadband illumination. The speckle contrast reduction resulting for illumination of the screens with different bandwidths can be modeled. The thesis also proposes yet another approach for speckle reduction by using colloidal-dispersion-filled rear projection screens. As a result, there is no necessity for using any additional components such as moving or rotating diffusers to achieve the time variation. The thesis also discloses the combination of low-speckle laser projection with a near infrared board-area vertical-cavity surface-emitting laser (BA-VCSEL). Three speckle contrast reducing effects are proposed, which are polarization scrambling of the paper screen, a thermally induced shift in the BA-VCSEL's emission wavelength and the reduced spatial coherence of the source.

SUMMARY

Therefore, an object of the present disclosure is to provide a vertical-cavity surface-emitting laser (VCSEL) device with low speckle by varying the epitaxial-growth and wafer process designs by i) variation of p-contact metal inner diameter (p-CM ID) (d3), ii) variation of GaAs surface relief diameter (SR Dia) (d4), iii) variation of oxide aperture diameter (OXD) (d2), and iv) variation of mesa diameter (MSD) (d1). These key parameters d1, d2, d3, and d4 are arranged in such way that there exists a certain relationship among them to produce reduced speckle and increased signal-to-noise ratio (SNR). Moreover, in VCSEL arrays, the emitters arranged in random fashion so that there is a lack of definite constant pitch among them paving an inhomogeneous emission matrix with constant intensity.

BRIEF DESCRIPTION OF THE DRAWINGS

Other features and advantages of the disclosure will become apparent in the following detailed description of the embodiment with reference to the accompanying drawings.

FIG. 10A being original, FIG. 10B being 180 degrees horizontally flipped, FIG. 10C being 180 degrees vertically flipped, FIG. 10D being 180 degrees horizontally and vertically flipped simultaneously, FIG. 10E being 90 degrees rotation in clockwise, and FIG. 10F being 270 degrees rotation in clockwise.

DETAILED DESCRIPTION

A laser, specially a vertical-cavity surface-emitting laser (VCSEL) that emits more than one transverse mode, can produce statistically independent speckle patterns. All of the emitted transverse modes are individually, fully and spatially coherent and will produce a speckle pattern which is statistically independent from others, and so the VCSEL can be modeled as a light source that doesn't emit transverse modes (quasi single mode regime with oxide aperture diameter about 3-5 μm), but a large number of beamlets (VCSEL arrays) that are mutually in-coherent. Thus the superposition of M quasi-random interference and fully de-correlated patterns should form a more homogeneous intensity distribution given by:

$$C = \frac{\sqrt{\sum_{n=1}^{M} \bar{I}_n^2}}{\sum_{n=1}^{M} \bar{I}_n} .,$$ (Equation-2)

wherein $\bar{I}_n$ is the mean intensity of the n-th pattern. The minimum achievable speckle contract is given by $1/M^{1/2}$ which results all superimposed speckle patterns that have same intensity. So all values between $C=1$ to $C=1/M^{1/2}$ are possible.

Figure 4B:
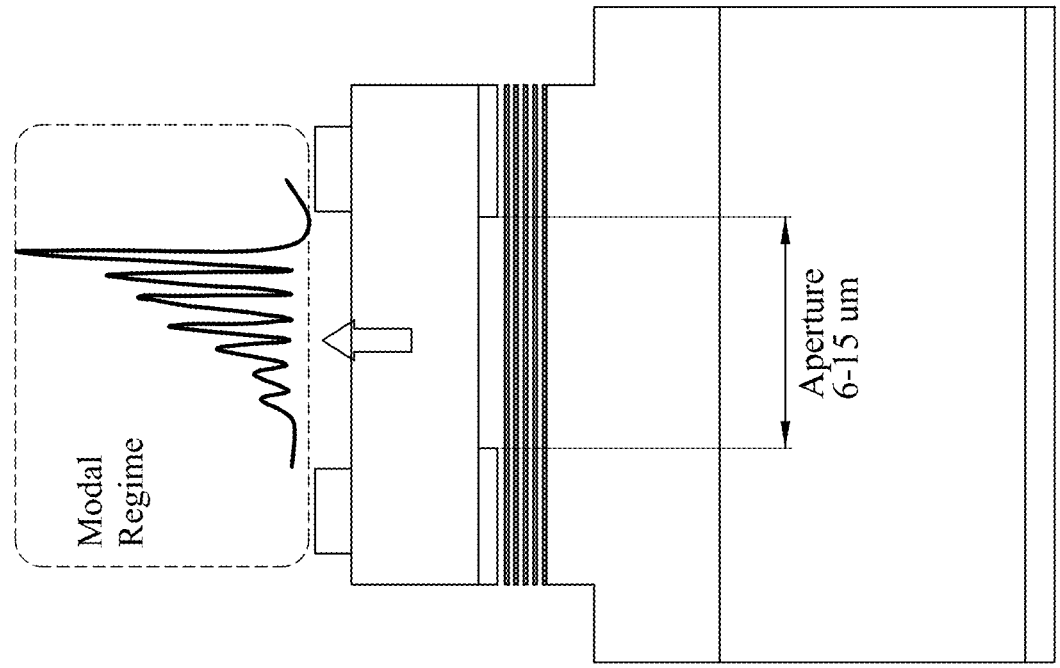
FIGS. 4A and 4B are schematic views of the conventional VCSEL device in non-modal (FIG. 4A) and modal (FIG. 4B) regimes. Inside the dotted enclosure, the curves represent a number of transverse modes in emission wavelength optical spectra corresponding to FIG. 4A and FIG. 4B.
Figure 4A:
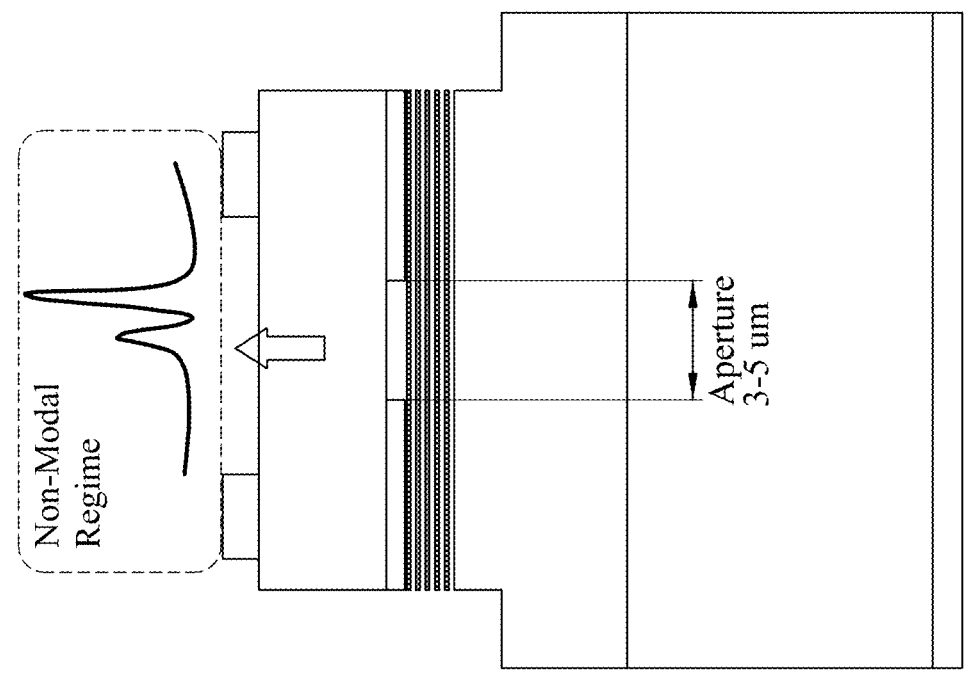

The VCSELs are standard semiconductor laser sources that emit light normal to the epitaxial-growth direction of its cavity. Because of its short cavity length (about 1.0 μm or less) which is of the order of one-wavelength, only one longitudinal mode can be lasing. Single transverse (non-modal regime) operation is achievable with oxide apertures about 3-5 μm. For larger apertures (6-15 μm, modal regime) and higher continuous wave (CW) driving currents, the emission of VCSEL typically consists of a large number of transverse modes. A schematic non-modal and modal-operation regimes of VCSEL with emitting transverse modes are shown in FIGS. 4A and 4B.

There are three major contributing speckle contrast reducing effects, namely polarization scrambling, thermally induced chirp, and spatial and temporal coherence. As laser (VCSEL) speckle directly results from the coherence of laser source, reduction of sources spatial or temporal coherence is a promising way. The temporal coherence of a laser is defined by a coherence length as the propagation distance it maintains. Degree of coherence is defined by:

$$Lc = \lambda^2/\Delta\lambda \qquad \text{(Equation-3)},$$

wherein $\lambda$ is emission wavelength and $\Delta\lambda$ is spectral bandwidth. The degree of coherence of the illuminating VCSEL is smaller than the surface roughness, due to the lack of distinct phase relationship the speckle contrast C will be reduced and sometimes even speckle-free (high quality) images can be generated. For laser diodes, degree of coherence is in the range of 500 µm to 1.0 mm.

Even more promising way of speckle reduction is VCSELs operation in non-modal regime FIG. 4A where all VCSEL apertures can be modeled as being filled with mutually independent and non-interfere Gaussian beamlets. A VCSEL in non-modal regime (similar to single mode behavior) with output peak powers of few 10 mW with Gaussian farfield have benefit of low degree of spatial coherence.

In regard of thermally induced chirp, the emission wavelength of the VCSEL in pulsed operation can shift several nanometers depends on the current bias condition (pulse width and amplitude). If the camera integration time (typically about 90 µs) is longer than the typical pulse duration (2 µs), speckle contrast can be significantly reduced. In modal operation of VCSELs, each transverse mode in the cavity is individually, fully and spatially coherent (assuming no frequency degeneracy of modes), but the degree of coherence of the superposition of all transverse modes in the cavity is reduced. As the bias current increases, the number of transverse modes increases and the spatial coherence of the laser beam decreases. If each of the modes produces a speckle pattern, that is partly de-correlated from others, the resulting speckle contrast of the superpositions of the patterns will decrease. Such as decorrelation can be achieved if the different transverse modes have slightly different emission wavelengths or illuminate different positions on the screen. Therefore, in modal emission regime of VCSEL, it is difficult to estimate the exact number of modes and their coherence and hence reduction of speckle contrast.

Figure 1A:
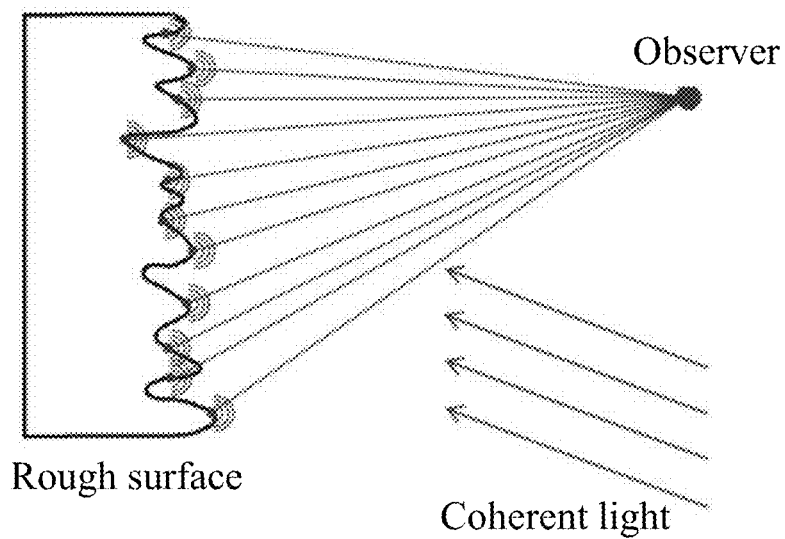
FIG. 1A is a schematic view of speckle formation from a scattered light when coherent light propagates on a rough surface.
Figure 1B:
FIG. 1B is an image with speckle.
Figure 1C:
FIG. 1C is an original image without speckle.
Figure 2A:
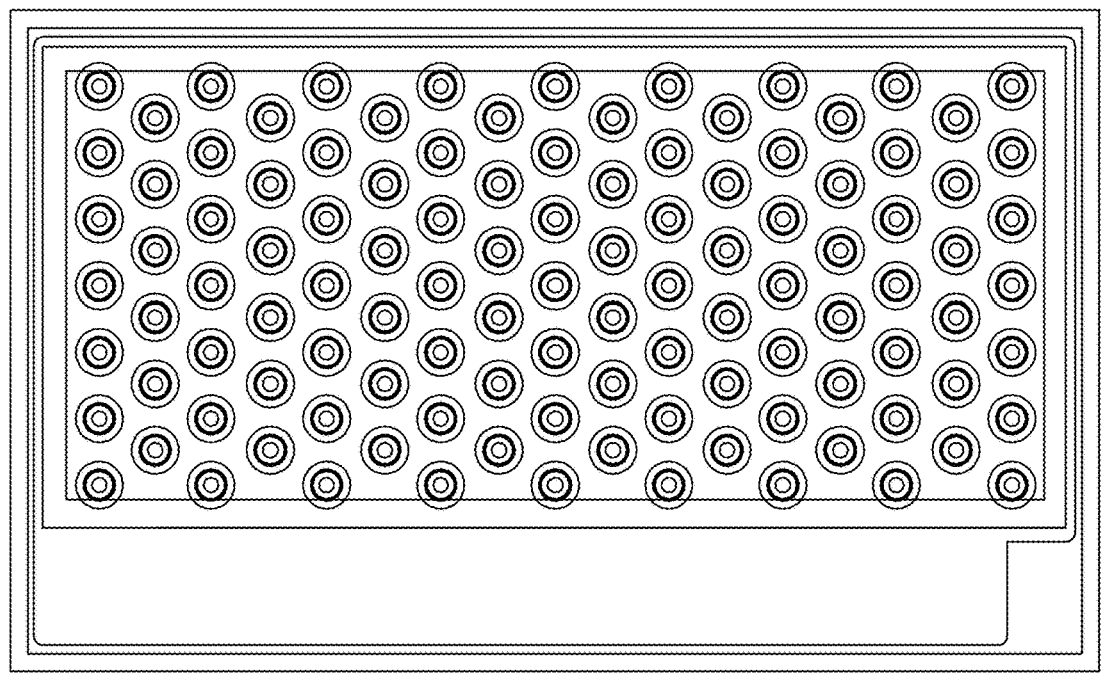
FIGS. 2A to 2D schematically show a prior-art representing VCSEL arrays in regular/standard (trainagular) fashion used for speckle contrast study.
Figure 2B:
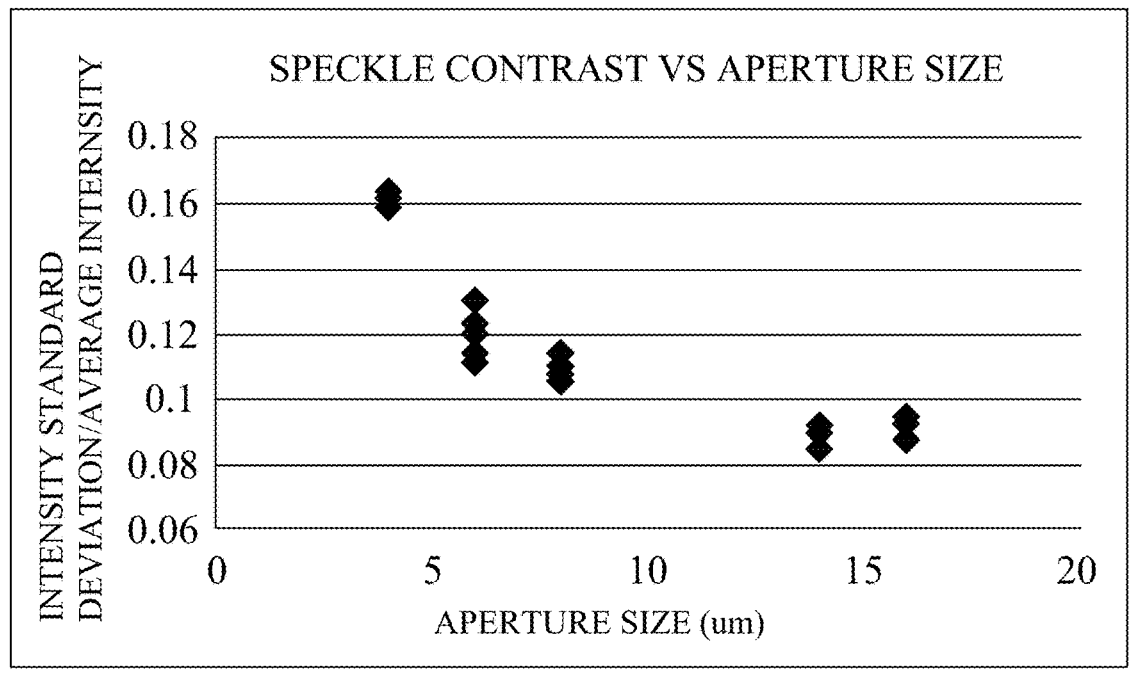
Figure 2C:
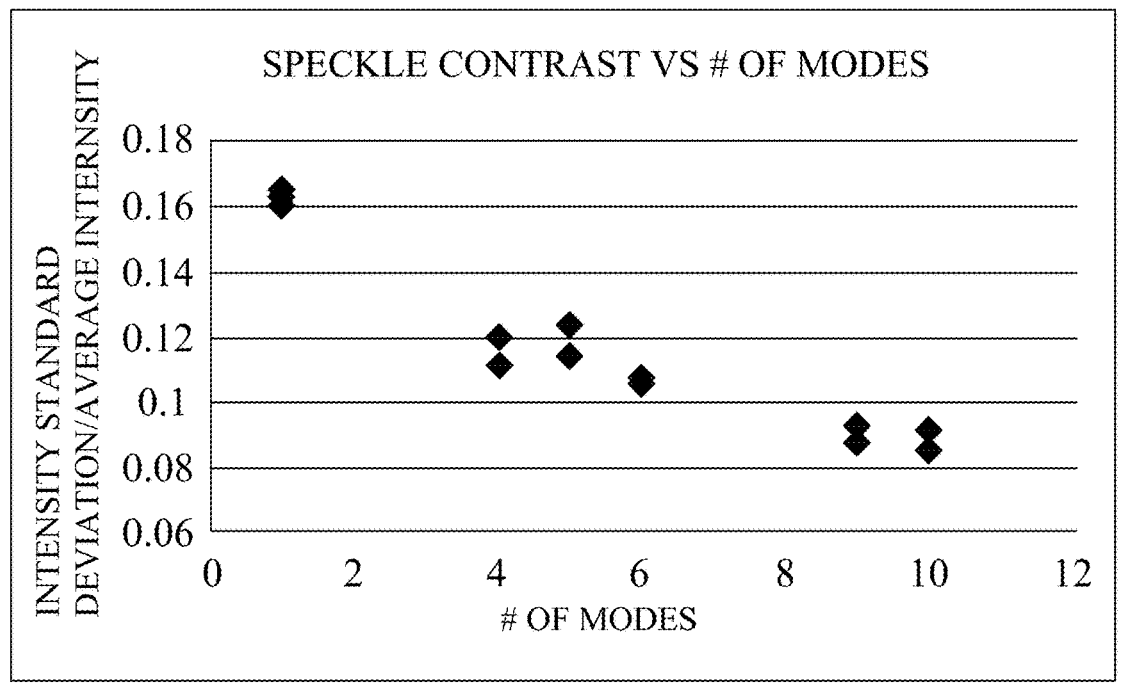
Figure 2D:
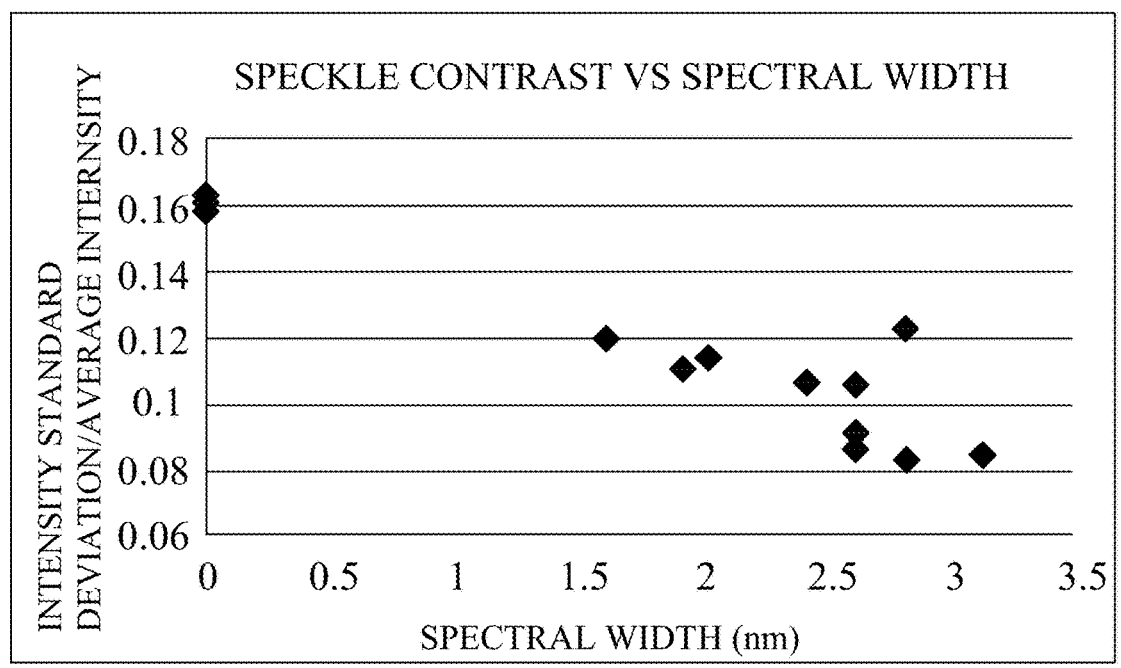

FIG. 1A illustrates speckle formation from a scattered light when coherent light propagates on a rough surface. Here each point of the illuminated surface can be seen as a secondary source, emitting spherical waves into free space. The quasi-random interference pattern generated by spherical wavefronts (amplitudes and phases) emerges as a speckle, because the phases determined by the distance between secondary source and observer point and amplitudes are determined by same distances, the surface reflectivity and illuminating light filed. As optical sensing with VCSEL arrays/emitters involves scanning the depth (roughness) of 3-D objects, it is significant to have a constant intensity profile from 3-D object with minimul possible speckle contrast ratio paving a way to high quality image display as shown in FIG. 1C, an image without speckle.

FIGS. 4A and 4B illustrate VCSEL devices in non-modal (FIG. 4A) and modal (FIG. 4B) regimes. According to abovementioned equation (2), the speckle contract ratio C is inversely related to the number of transverse modes, it is natural to see smaller C with several multi-transverse modes. Single transverse (non-modal operation with smaller oxide apertures) regime is a promising way to get lower speckle and higher SNR. In multi-transverse mode (modal operational with larger oxide apertures) regime, higher CW driving currents are needed to get smaller C. Often many transverse modes causes noise in the optical spectra and degrades the image quality through presense of speckle.

FIGS. 2A to 2D show a prior art (US Patent Publication No. US 2016/0352074 A1) representing a schematic of VCSEL arrays in regular/standard (trainagular) fashion used for speckle contrast study, which does not disclose any specific method to reduce the speckle contrast ratio C.

Figure 3:
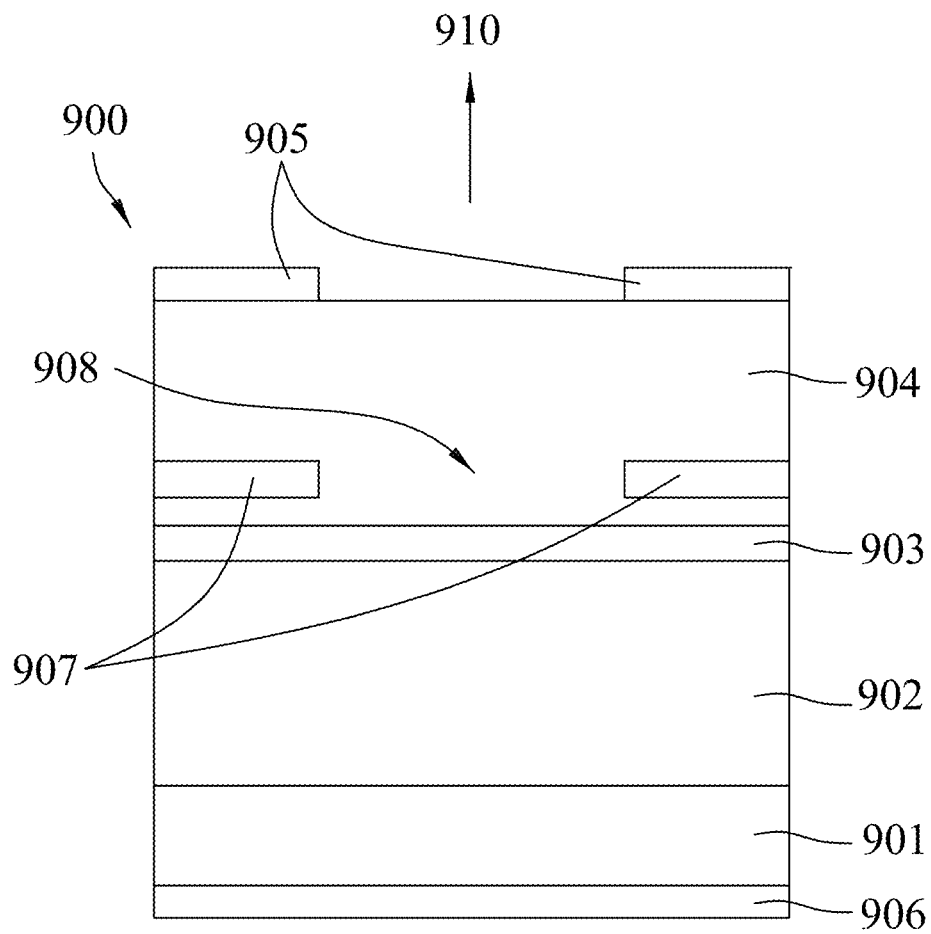
FIG. 3 is a schematic view of a conventional VCSEL.

FIG. 3 is a conventional VCSEL device 900 includes a substrate 901, a bottom distributed Bragg reflector 902 disposed on the substrate 901, an active layer 903 disposed on the bottom distributed Bragg reflector 902, a top distributed Bragg reflector 904 disposed on the active layer 903, a top electrode 905 disposed on the top distributed Bragg reflector 904, a bottom electrode 906 connected to the substrate 901 opposite to the bottom distributed Bragg reflector 902, and a confinement member 907 formed in the top distributed Bragg reflector 904 and defining an aperture 908 through which a laser beam 910 emitted by the active layer 903 passes.

When operating the conventional VCSEL 900, the top electrode 905 and the bottom electrode 906 are connected to an external power source (not shown) to provide electrical energy to the active layer 903, which then emits the laser beam 910 that oscillates between the top distributed Bragg reflector 904 and the bottom distributed Bragg reflector 902, and eventually exits the conventional vertical cavity surface emitting laser device 900 through the aperture 908 defined by the confinement member 907.

Figure 5:
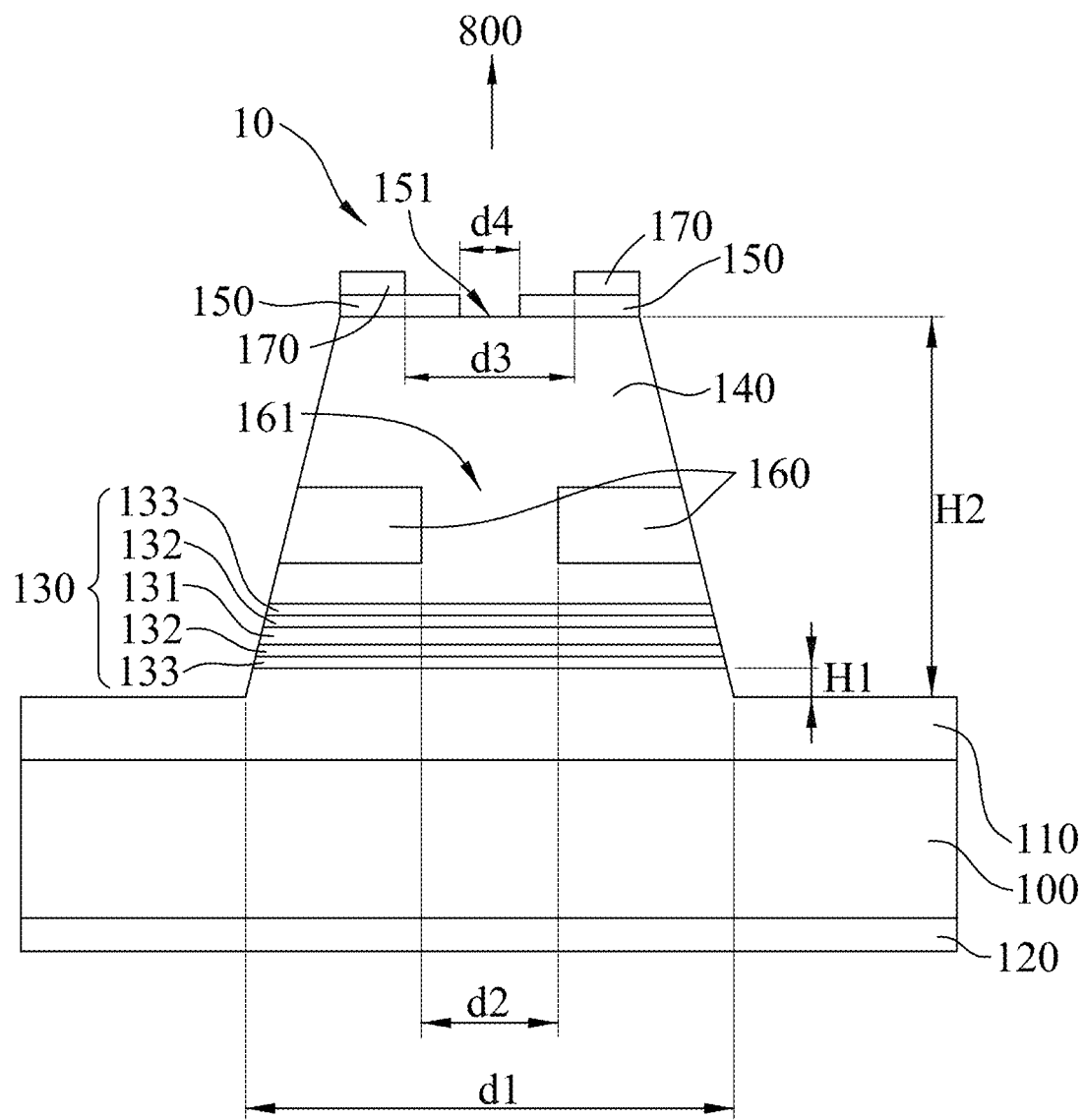
FIG. 5 is a schematic view of an embodiment of a low-speckle VCSEL device according to the present disclosure by varying the epitaxial-growth and wafer process designs by i) variation of p-contact metal inner diameter (p-CM ID) (d3), ii) variation of GaAs surface relief diameter (SR Dia) (d4) iii) variation of oxide aperture diameter (OXD) (d2) and iv) variation of mesa diameter (MSD) (d1).

FIG. 5 shows an embodiment of a VCSEL device 10 according to the present disclosure. In this embodiment, the VCSEL device 10 includes a substrate 100, a first-type doped distributed Bragg reflector 110, a first electrode 120, an active layer 130, a second-type doped distributed Bragg reflector 140, a surface relief layer 150, a confinement member 160 and a second electrode 170.

The first-type doped distributed Bragg reflector 110 is disposed on the substrate 100. The first electrode 120 is connected to the substrate 100. The active layer 130 is disposed on the first-type doped distributed Bragg reflector 110. The second-type doped distributed Bragg reflector 140 is disposed on the active layer 130. The surface relief layer 150 is formed on a top surface of the second-type doped distributed Bragg reflector 140 and has a surface relief indentation 151. The second electrode 170 is disposed on the surface relief layer 150.

In this embodiment, the first electrode 120 is located at the bottom of the substrate 100 opposite to the first-type doped distributed Bragg reflector 110.

The substrate 100 may be n-type, p-type, un-doped or semi-insulating GaAs substrates. In this embodiment, the substrate 100 is a n-type GaAs substrate. The first electrode 120 is made of an electrically conductive material.

The first-type doped distributed Bragg reflector 110 may be a n-type doped distributed Bragg reflector or a p-type doped distributed Bragg reflector, and the second-type doped distributed Bragg reflector 140 has a polarity opposite to that of the first-type doped distributed Bragg reflector 110. In this embodiment, the first-type doped distributed Bragg reflector 110 is the n-type doped distributed Bragg reflector, and the second-type doped distributed Bragg reflector 140 is the p-type doped distributed Bragg reflector. Each of the first-type and second-type doped distributed Bragg reflectors 110, 140 is made of a stack of layers having varying refractive index numbers, and may be made of an aluminum gallium arsenide semiconductor material having a formula of $Al_xGa_{1-x}As$, where x ranges from 0 to 1.

In this embodiment, the active layer 130 includes a quantum well layer 131 made of either GaAs or $In_xGaAs$ with x ranging from 0.02 to 0.35, and that has a thickness ranging from 2 nm to 12 nm. Alternatively, the active layer 130 may include multiple quantum well layers 131 (i.e., a quantum well layer stack). The active layer 130 may further include two barrier layers 132 that are respectively connected to opposite sides of the quantum well layer 131 to form a double heterostructure. Each of the barrier layers 132 is made of either $Al_xGa_{1-x}As$ (x=0.15 to 0.4), $GaAs_{1-y}P_y$ (y=0.15 to 0.3) or GaAs. In certain embodiments, tensile strained $GaAs_{1-y}P_y$ and compressively strained $In_xGaAs$ quantum wells form a strained compensated double heterostructure. Alternatively, the number of the barrier layers 132 may be more than two, and the barrier layers 132 are connected to the opposite sides of the quantum well layer 131 at equal amount. Two separate confinement heterostructure layers 133 are respectively connected to the barrier layers 132 opposite to the quantum well layer 131. Each of the separate confinement heterostructure layers 133 may have a graded index separate confinement heterostructure layer made of $Al_xGaAs$ with x ranging from 0.15 to 0.75, and may have a thickness ranging from 4 nm to 120 nm.

The confinement member 160 is formed in the second-type doped distributed Bragg reflector 140, and is located between the surface relief layer 150 and the active layer 130. The confinement member 160 defines an aperture 161 that is adapted for a laser beam 800 generated by the active layer 130 to pass therethrough. Here the confinement member 160 is either made of a (proton ion) implanted semiconductor material, which is implanted with one of hydrogen ions ($H^+$), helium ions ($He^+$), oxygen ions ($O^+$), and combinations thereof, or wet thermal oxidation process, referred as Oxide Aperture Diameter (OXD) throughout this disclosure. In certain embodiments, the confinement member 160 is made of only proton implanted AlGaAs/GaAs multilayer stack. For wet oxidation based case, the confinement member 160 is made of AlxGa1-xAs (x=0.98 to 1.0).

An upper portion of the first-type doped distributed Bragg reflector 110, the active layer 130 and the second-type doped distributed Bragg reflector 140 form an angled mesa structure that is tapered from the upper portion of the first-type doped distributed Bragg reflector 110 to the second-type doped distributed Bragg reflector 140.

A bottom diameter (d1) of the mesa structure is larger than a diameter (d2) of the aperture 161, and the diameter (d2) of the aperture 161 is larger than a diameter (d3) of p-contact metal and this in turn larger than a diameter (d4) of the surface relief indentation 151 of the surface relief layer 150. In certain embodiments, the bottom diameter (d1) of the mesa structure ranges from 16 μm to 48 μm, aperture diameter (d2) ranges from 3 μm to 15 μm, p-CM ID (d3) ranges from 8 μm to 17 μm and the surface indentation he diameter (d4) of the surface relief layer 150 ranges from 1 μm to 6 μm.

When the first electrode 120 and the second electrode 170 are connected to the external power source, an electrical current flows therebetween and passes through the active layer 130, and the active layer 130 emits the laser beam 800. In this embodiment, the second-type doped distributed Bragg reflector 140 is configured to have a reflectivity less than that of the first-type doped distributed Bragg reflector 110, allowing the laser beam 800 to be upwardly emitted from the semiconductor laser device 10.

Figure 6:
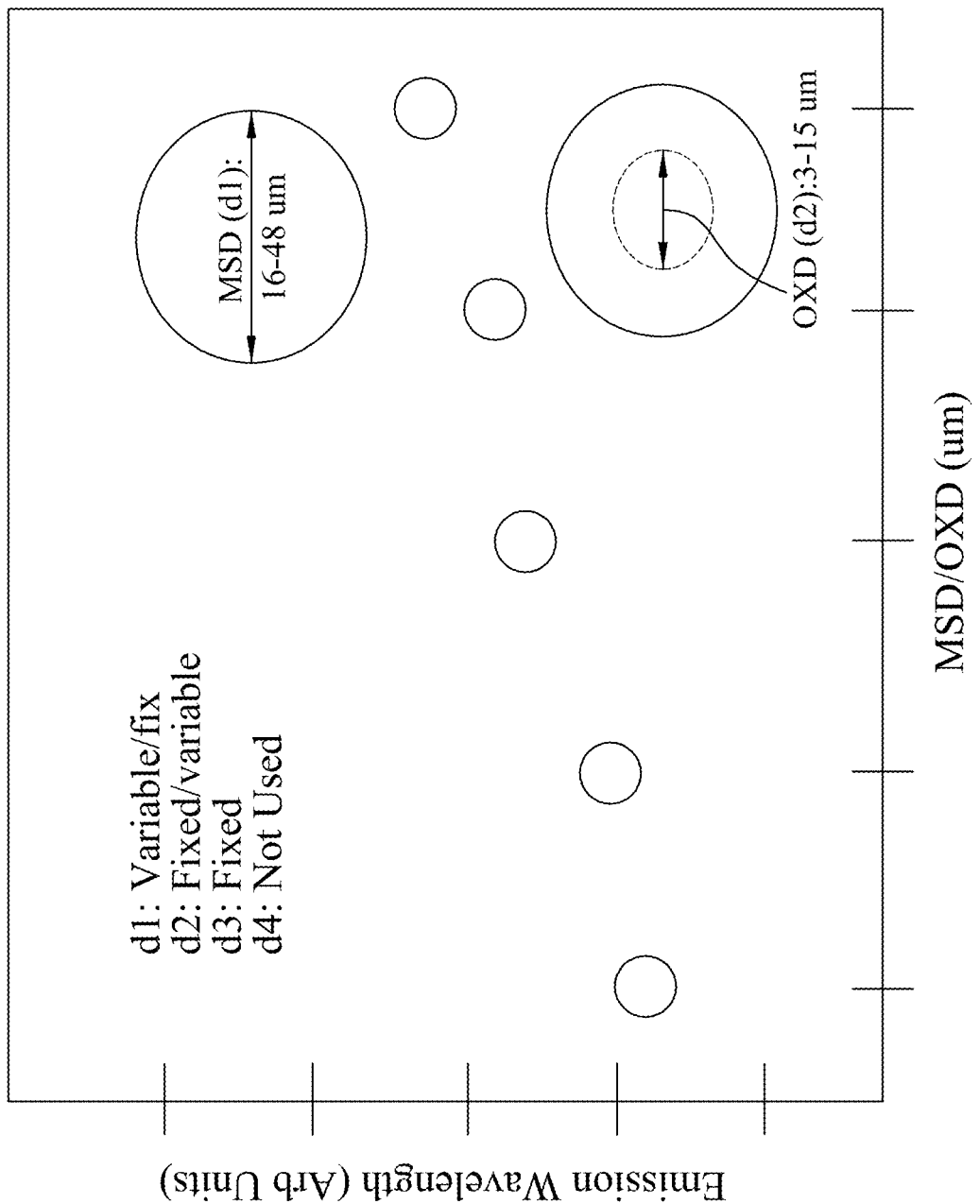
FIG. 6 is a schematic view of the embodiment of the VCSEL device for obtaining low-speckle by controlling emission wavelength by variation of mesa diameter (MSD) (d1).

FIG. 6 is a representation of change of emission wavelength by varying the bottom mesa diameter (d1). The emission wavelength difference between two or among several VCSELs supports lower speckle contrast ratio by generating a constant intensity profile from a rough/diffused 3D object. This can also be achieved by varying the diameter (d2) of the oxide aperture 161 from 3.0 to 5.0±1.0 μm for non-modal regime and 6.0 to 15.0±1.0 μm for modal regime.

Figure 7:
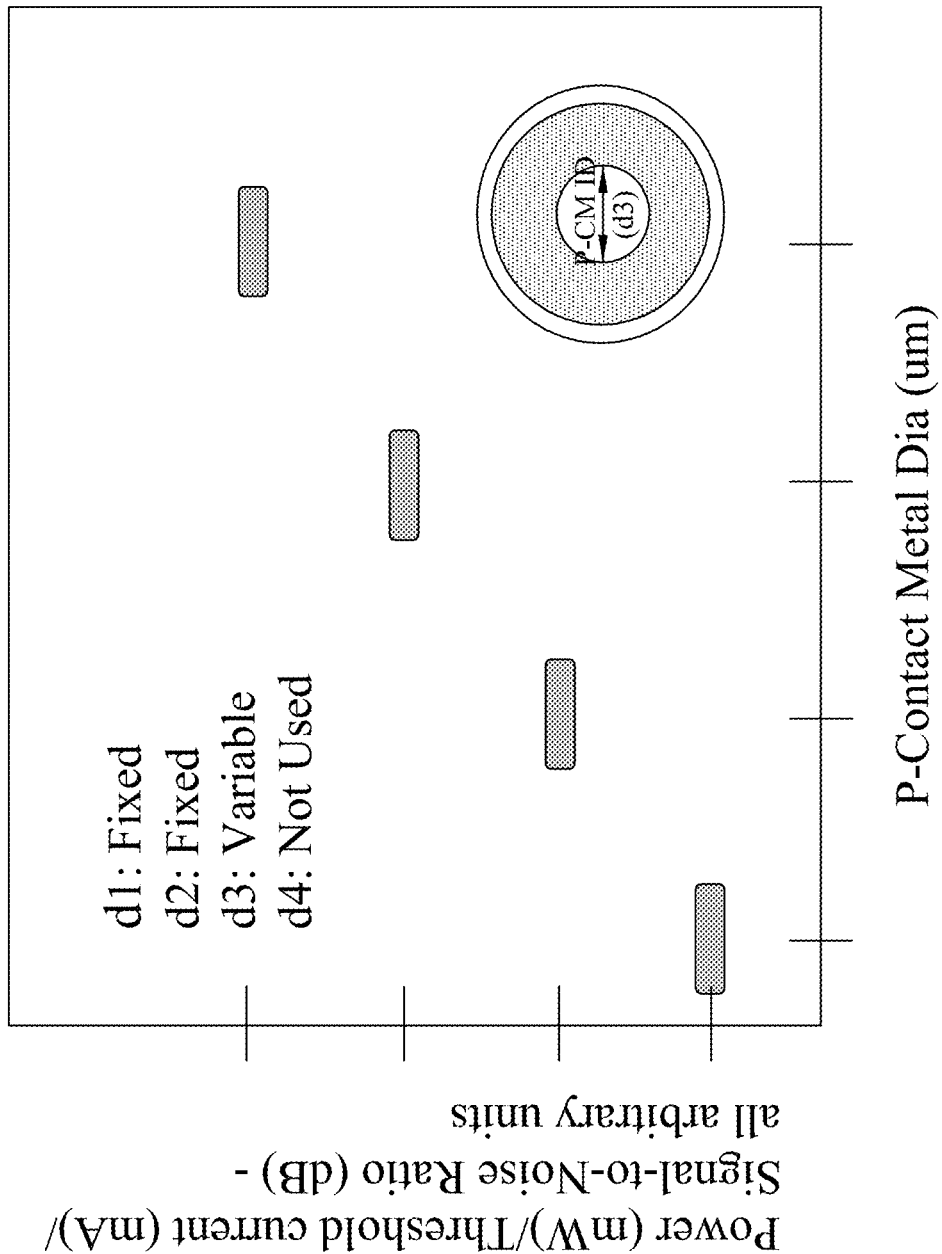
FIG. 7 is a schematic view of the embodiment of the VCSEL device for obtaining low-speckle by controlling output power, threshold current and SNR by variation of p-CM ID (d2).

Referring to FIG. 7, in this embodiment, the second electrode 170 is also made of an electrically conductive material. Therefore, the second electrode 170 in this embodiment (p-contact metal) is made to have a circular ring shape (Inner Diameter) so as not to block the aperture 161. By varying the p-CM ID in the range of 8.0 to 17.0 μm, one can control the o/p power, threshold current, angle of far-field that pave away for increased SNR.

Figure 8:
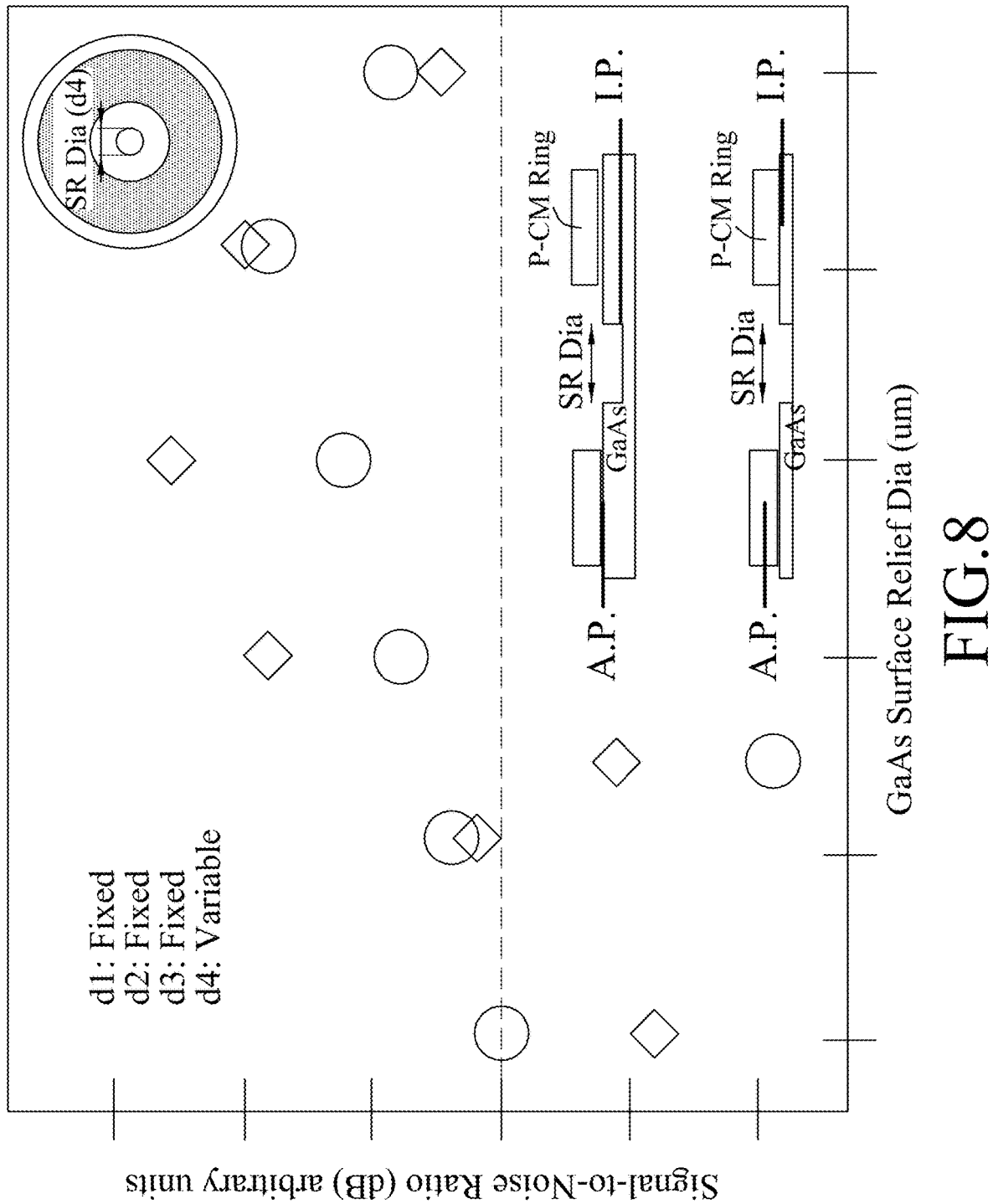
FIG. 8 is a schematic view of the embodiment of the VCSEL device for obtaining low-speckle by controlling SNR through filtering optical modes by variation of SR Dia (d4).
Figure 9B:
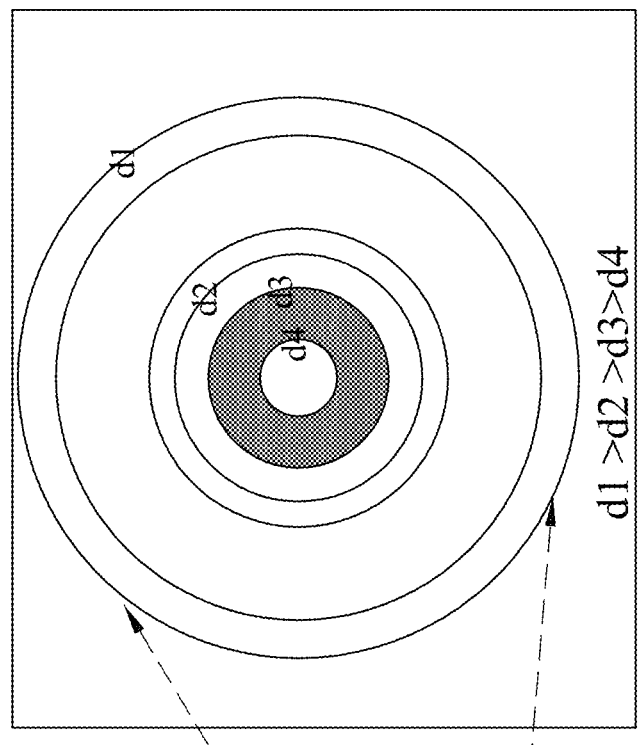
FIG. 9B is a top-view of a single VCSEL/emitter showing dimensions of d1, d2, d3 and d4.
Figure 9A:
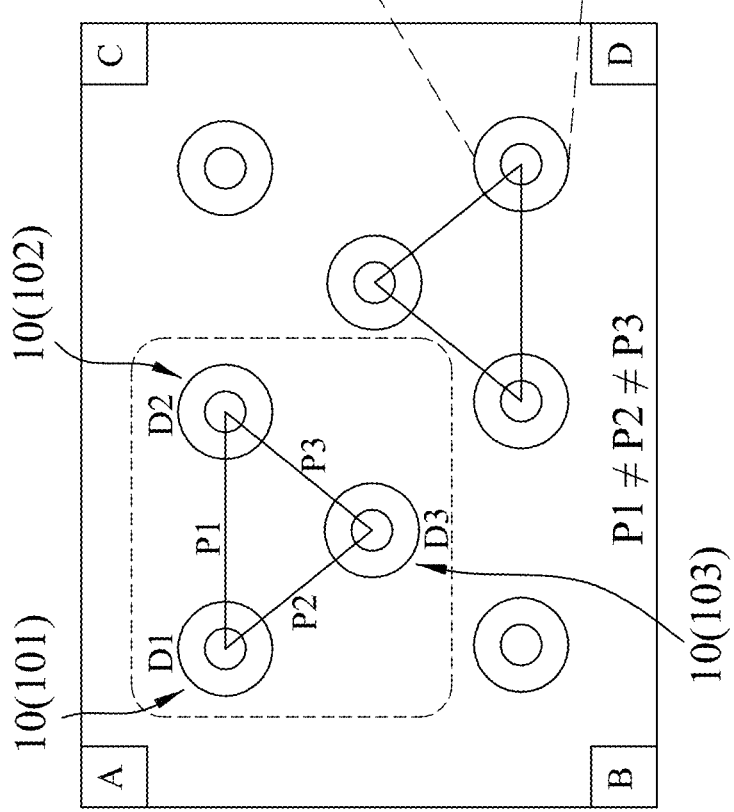
FIG. 9A is a schematic of arrangements of 8-element VCSEL emitters constituting an unitcell in the form of a 2-dimensional (2-D) matrix. A simple 3-emitter section shows different pitch among three emitters indicating non-uniform pitch.

FIG. 8 shows partially etched the surface relief layer 150 as surface relief indentation 151 (see FIG. 5). The diameter of the surface relief indentation (SR Dia.) 151 may be changed from 1.0-6.0 μm according to practical requirements of mode filtering function that results increased SNR for different operations modes of the semiconductor laser device 10. When the thickness of surface relief layer sets at ani-phase thickness and surface indentation is stopped at in-phase thickness of of optical filed distribution, the mode filtering is effective leading to the increased SNR. (Mode loss physics). Alternatively, the surface indentation can also be stopped at the top surface of p-DBR, when its thickness is terminated in-phase condition of optical field. Both the cases of variation of SNR as a function of SR Dia (d4) is shown in FIG. 8. FIG. 9A refers to an 8-element VCSEL/optical array includes a plurality of semiconductor laser devices that are randomly arranged in a 2-D matrix configuration. This can be considered as a basic cell with four corners A, B, C and D for defining large scale arrays. In this basic cell, three of the semiconductor laser devices 10 are defined as a unit cell (as shown in dotted line), and are respectively defined as a first semiconductor laser device 101, a second semiconductor laser device 102 and a third semiconductor laser device 103. In the unit cell, the bottom diameters of the mesa structures of the first, second and third semiconductor laser devices 101, 102, 103 are respectively defined as D1, D2 and D3. In the unit cell, a distance (i.e., pitch) between center points of the first and second semiconductor laser devices 101, 102 is defined as P1, a distance (i.e., pitch) between center points of the first and third semiconductor laser devices 101, 103 is defined as P2, and a distance (i.e., pitch) between center points of the second and third semiconductor laser devices 102, 103 is defined as P3. In the unit cell, P1 ranges from 0.75*(D1+D2) to 1.5*(D1+D2), P2 ranges from 0.75*(D1+D3) to 1.5*(D1+D3) and P3 ranges from 0.75*(D2+D3) to 1.5*(D2+D3). This, in any given situation, all 3 elements in the unit cell are related by P1, P2 and P3. FIG. 9B shows a top view of typical VCSEL as emitter with all four diameters d1, d2, d3 and d4 connected by a relation d1>d2>d3>d4.

Both the random arrangement (non-uniform pitch) of VCSEL emitters and four internal diameters (d1, d2, d3 and d4) made in such a way that emission wavelength for any given array always differs from every emitter and then difference in emission wavelengths interfere in far-field profile likely to generate a constant intensity pattern. According to the equation-1, this is essential for scanning rough/diffused surface of any 3-D object for generating a lower speckle contrast image for display.

Figure 10A:
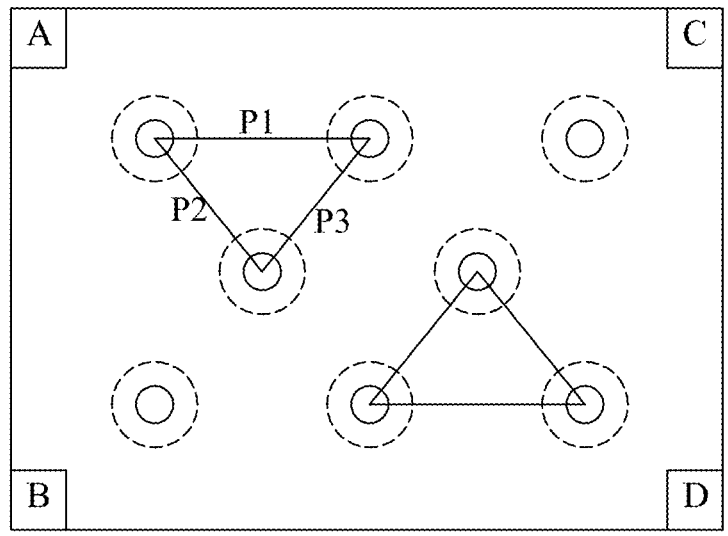
FIGS. 10A to 10F show arrangements of unit cells in different configurations.
Figure 10B:
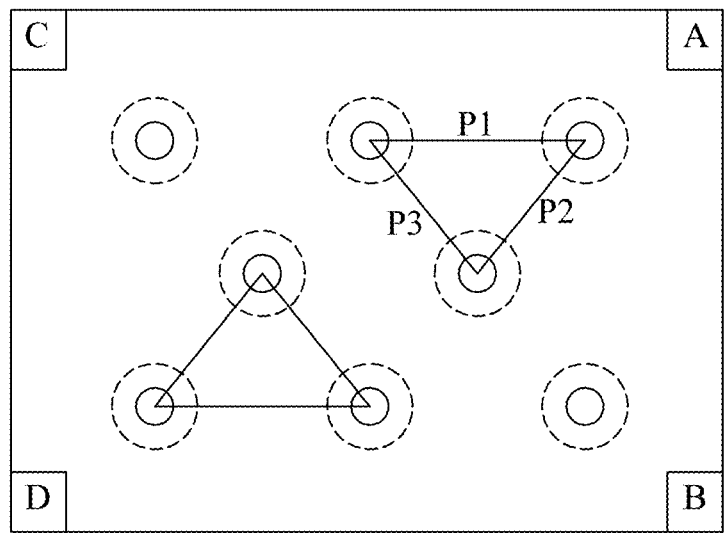
Figure 10C:
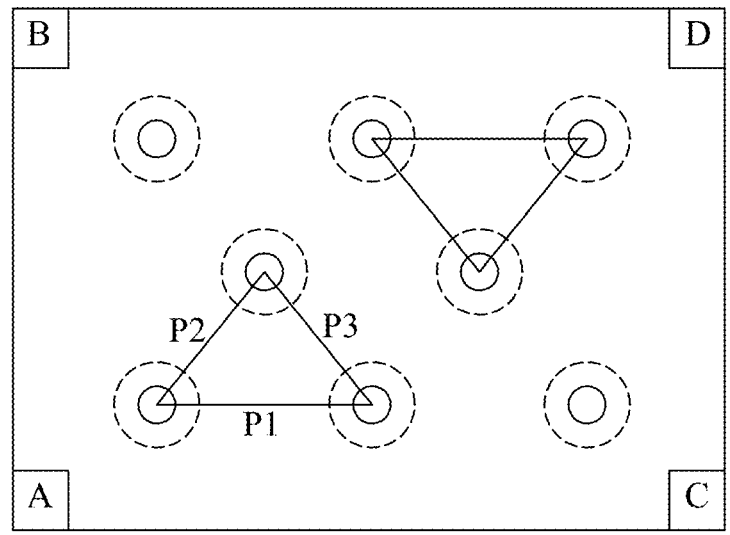
Figure 10D:
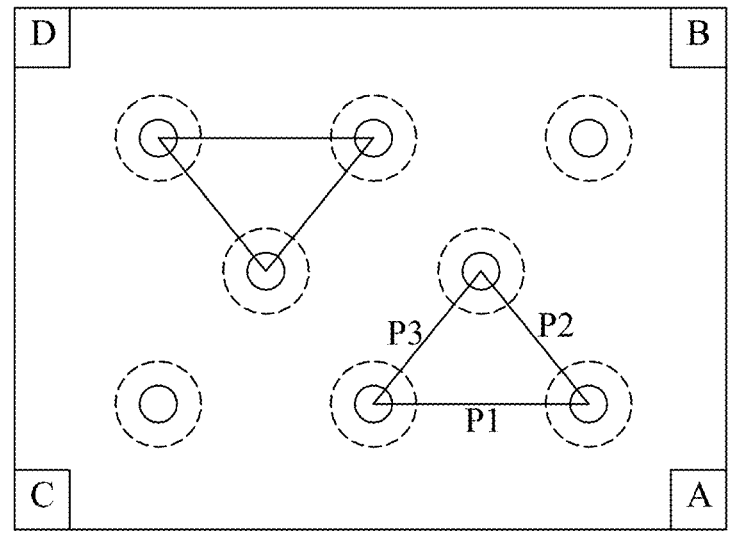
Figure 10E:
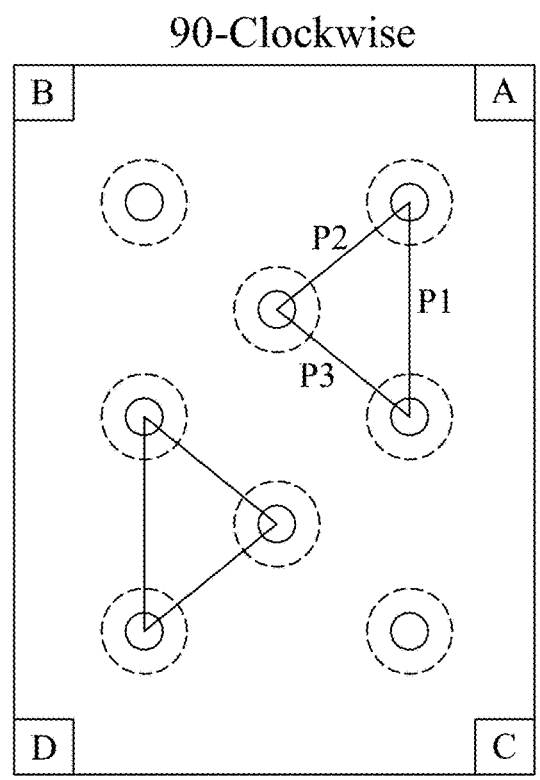
Figure 10F:
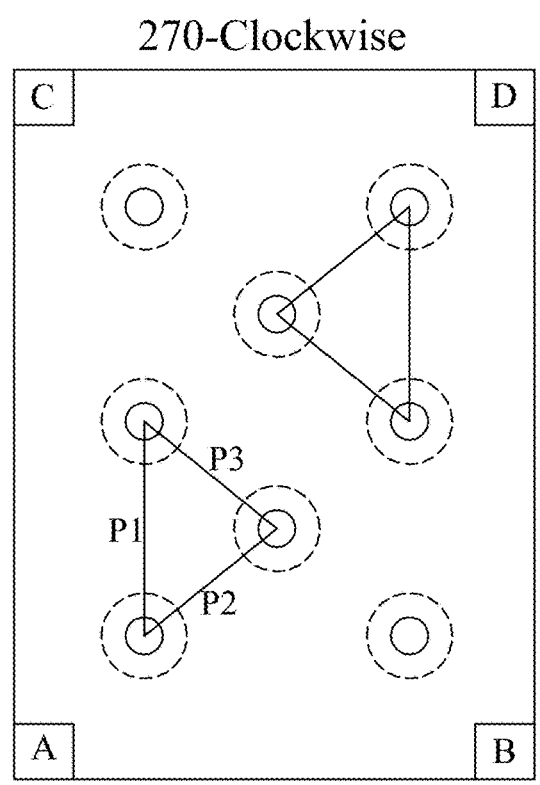

The 8-element original basic cell with four corners can be arranged in several combinations as shown in FIGS. 10A to 10F. This includes original (FIG. 10A), 180 degrees horizontally flipped (FIG. 10B), 180 degrees vertically flipped (FIG. 10C), 180 degrees horizontally and vertically flipped simultaneously (FIG. 10D), 90 degrees rotation in clockwise (FIG. 10E), and 270 degrees rotation in clockwise (FIG. 10F). This is to make sure for non-uniform pitch among VCSEL emitters (P1, P2 and P3) and individual variation of VCSEL internal diameters d1, d2, d3 and d4 so that for a given random array configuration, from cylindrical symmetry of mesa structures, two or more basic cell combinations can be followed and the emission wavelengths of all emitters are slightly differ from each others to generate an homogeneous/constant intensity pattern. The number of emitters in this random arrays be normally up to 2500 elements.

Figure 11:
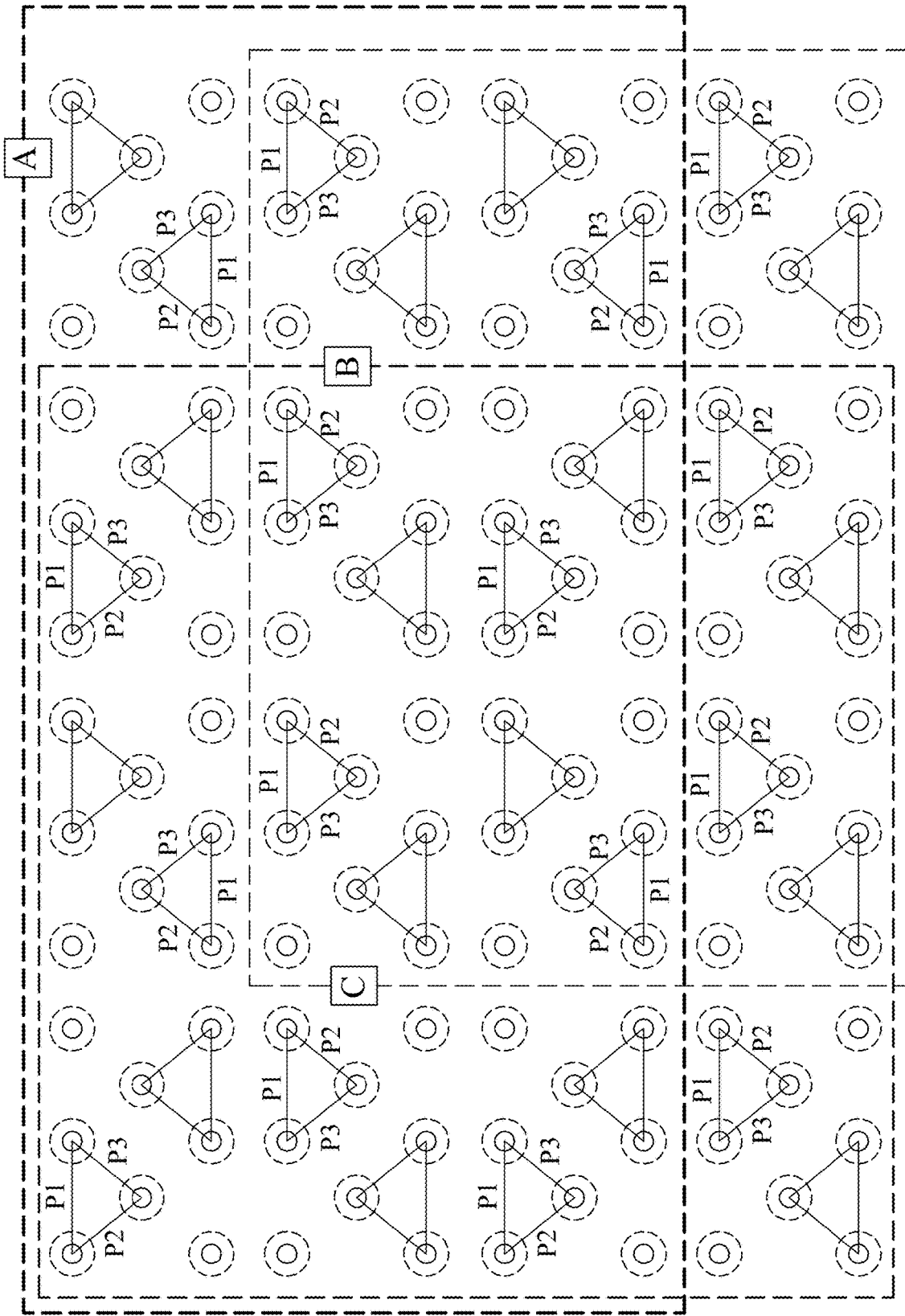
FIG. 11 is an embodiment of a random VCSEL array of the disclosure made from unit cells defined in FIG. 9 and and done with few combinations of unit cell arrangements shown in FIGS. 10A to 10F.
Figure 12:
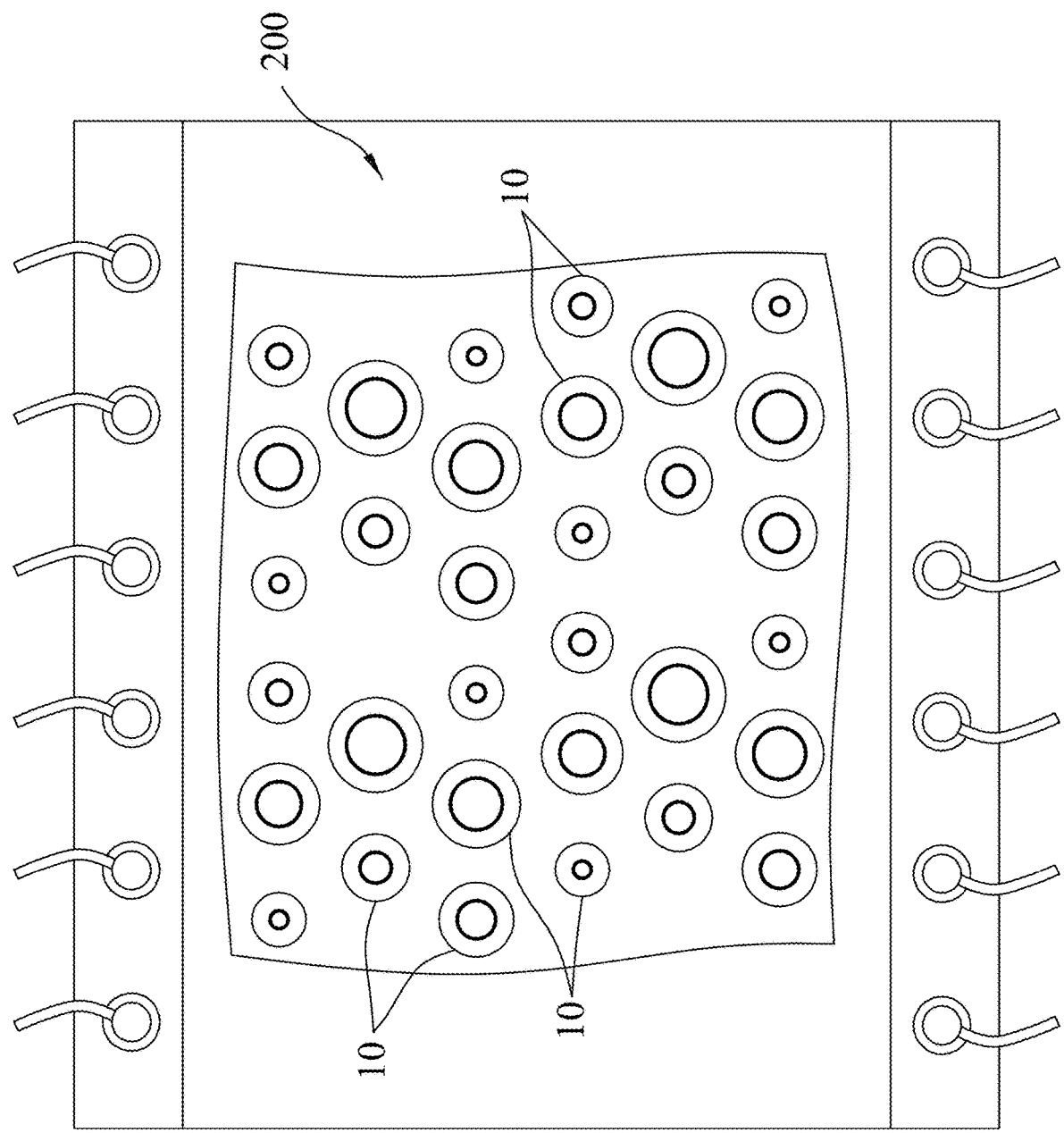
FIG. 12 is one practical random VCSEL 2-D array used for 3-D sensing applications. One can see that the mesa diameters and pitch-among VCSELs emitters are random and not have constant relationship.

FIG. 11 shows an example of randomly arranged VCSEL 2-D array. One can select any given combination given by dotted squares (A, B and C), depending on the number of emitters for practical needs. One such random array with 32-elements is shown in FIG. 12.

Figure 13:
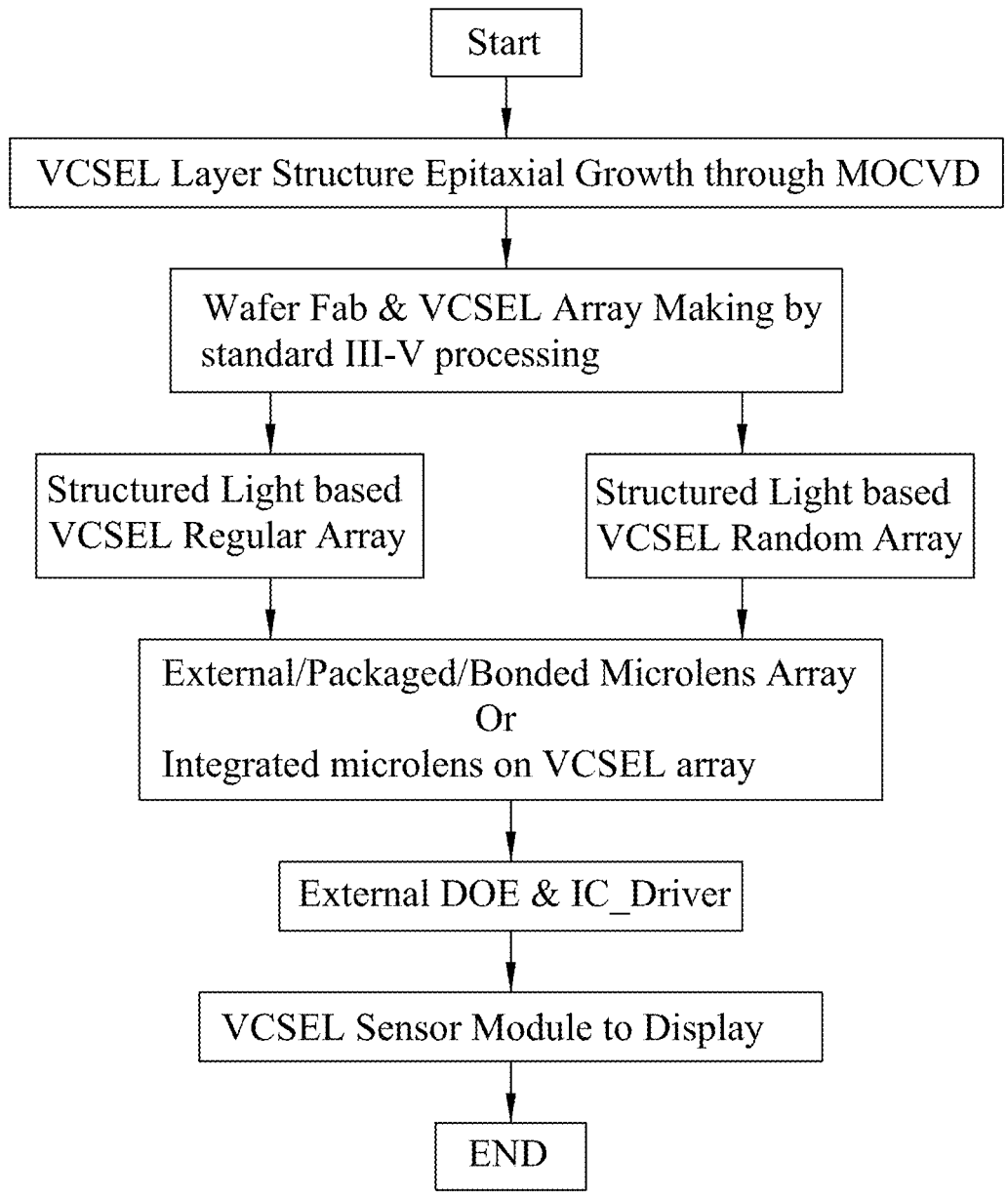
FIG. 13 is a flowchart showing an embodiment of a method of manufacturing a 3D sensor module made from random VCSEL array according to the disclosure.

FIG. 13 shows a flow chart for making VCSEL sensor module.

In this case, first the epi-structure is epi-axially grown by MOCVD and wafer/chip processing is done with standard III-V process techniques. Next the arrays will be classified as regular (uniform pitch) and random (non-uniform pitch). These VCSEL arrays will be assembled with external microlens arrays (MLAs). In some cases, MLAs can also be directly integrated on VCSEL arrays. Then the combination of VCSEL arrays with bonded/integrated MLAs are further assembled with diffractive optical elements (DOE) and IC drivers and finally to a display.

Figure 14:
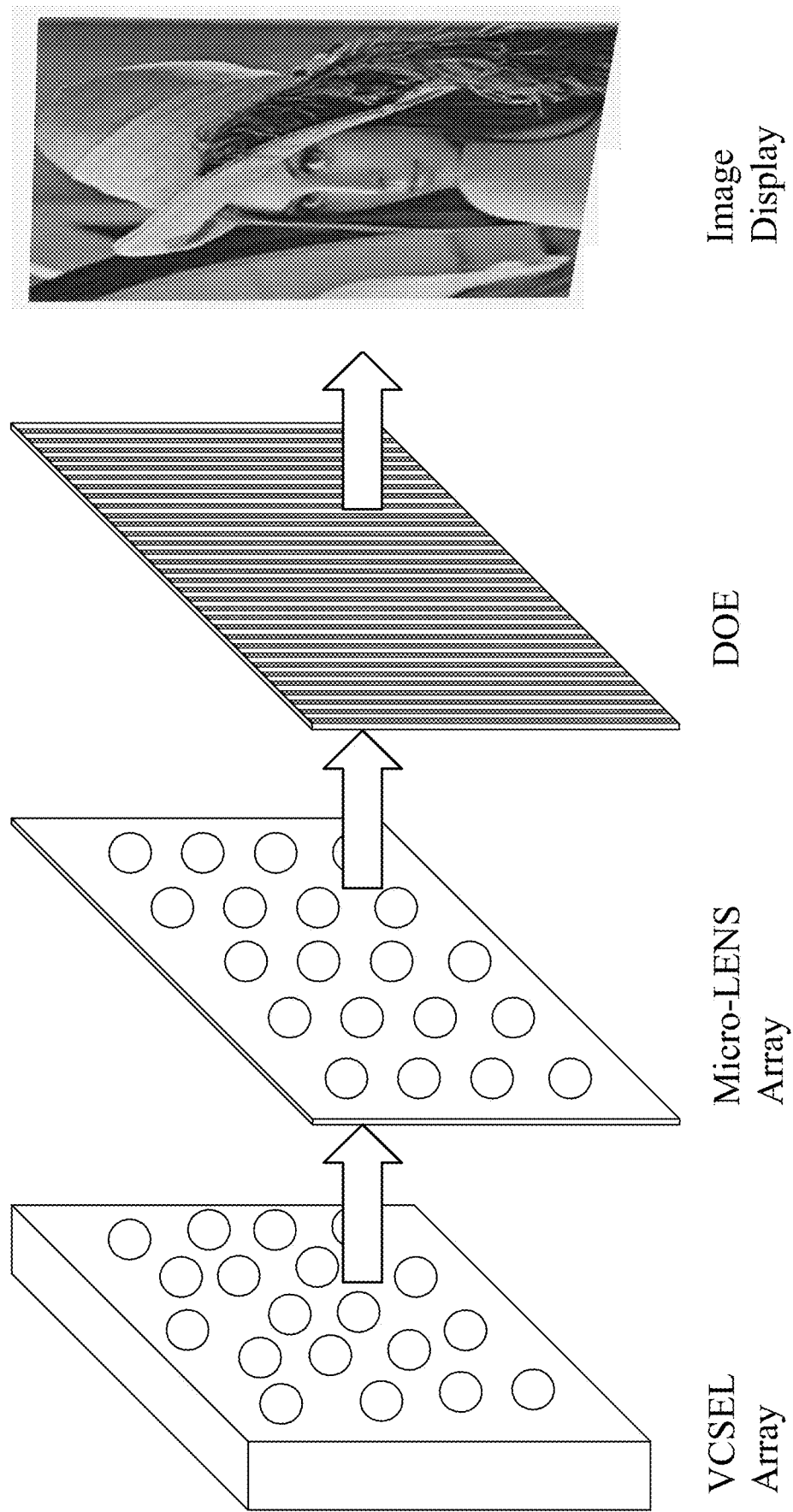
FIG. 14 is an illustration of optical sensor module that includes VCSEL array, microlens array (MLA), diffractive optical elements (DOE) and display.

FIG. 14 is an illustration of optical sensor module that includes the VCSEL array, a microlens array (MLA), the DOE and an image display. Here in VCSEL array, all emitters are randomly/inhomogeneously arranged such that there is a lack of uniform pitch among VCSELs, differs from regular array. This randomness is due to the combination of the MLA and the DOE. In practical optical sensing applications, the MLA has to be arranged in such away that that VCSEL array overlapped with MLA, which leads to reduced speckle and generates high quality images on display.

As an exemplary embodiment, an array of non-uniform mesa shapes that may pave the way for generating uniform intensity profile in far-filed pattern is also disclosed. This is due to the mode volume for a given circular, hexagonal and square mesa is slightly different and results in different emission wavelength. The array configuration is shown in FIG. 15.

Figure 15:
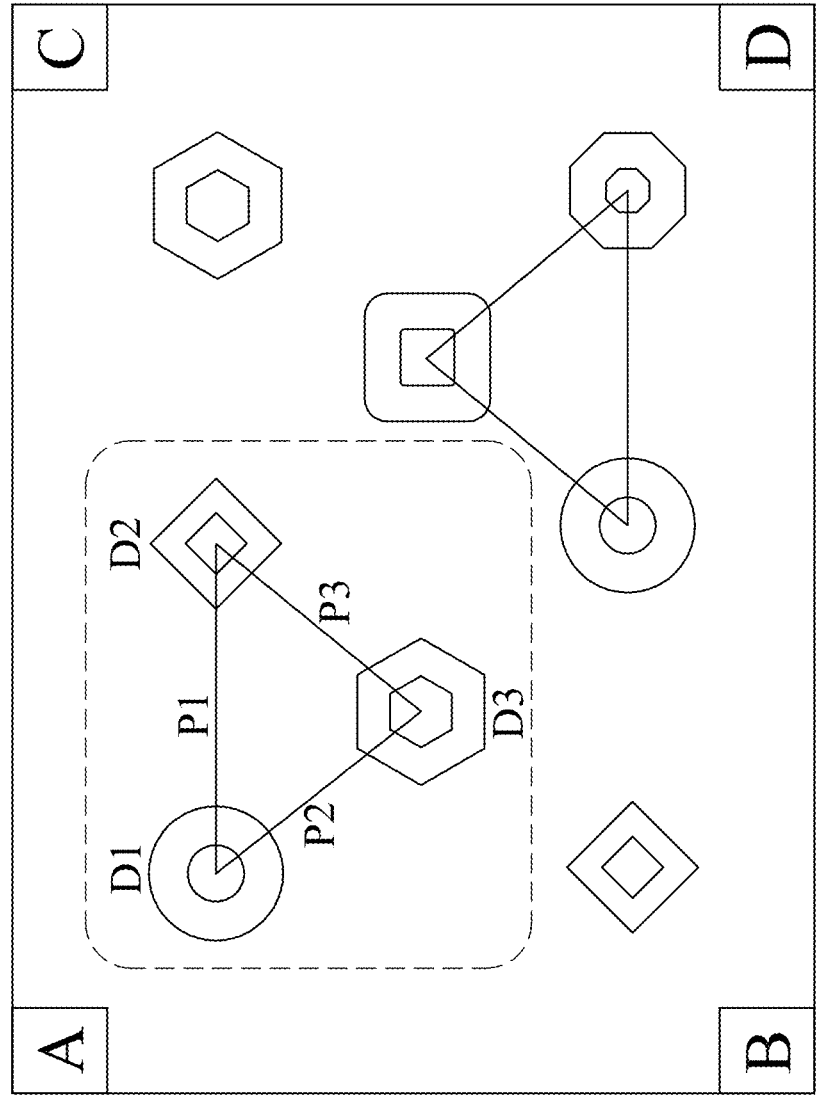
FIG. 15 is 2D-array array of non-uniform mesa shapes for generating uniform intensity profile in far-filed pattern. One can see that the mesa diameters and pitch-among VCSELs emitters are random and not have constant relationship.
Figure 16B:
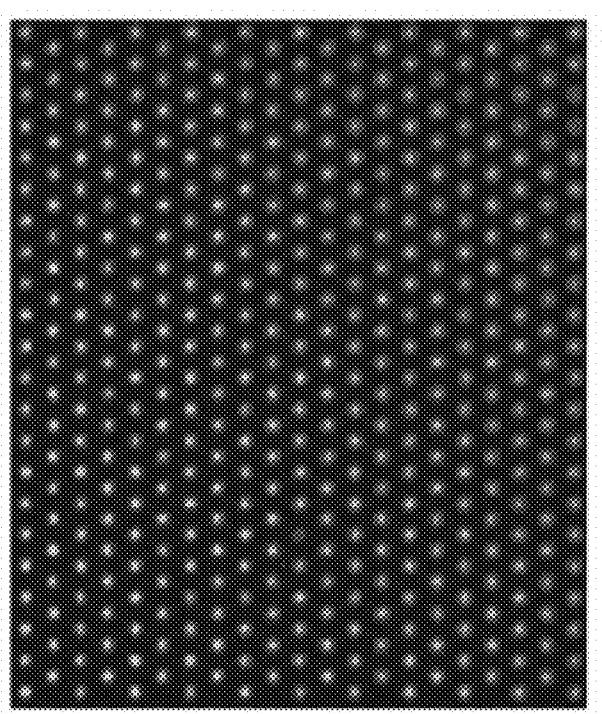
FIG. 16B is a 2D-intensity profile of VCSEL array of FIG. 16A.
Figure 16A:
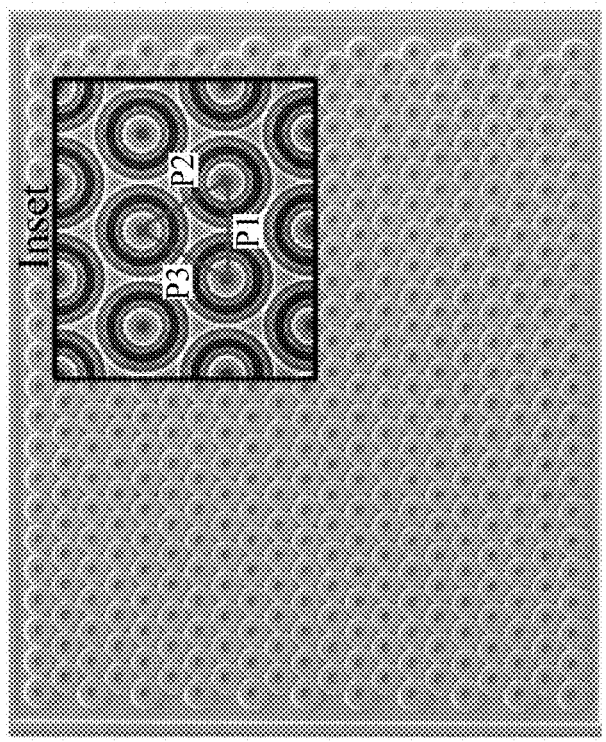
FIG. 16A is a SEM image of fully processed 940 nm VCSEL array with a hexagonal array. Inset of FIG. 16A shows zooming area of post-oxidation process of any until cell showing pitch among any 3 emitters.

An example of a fully processed 940 nm VCSEL array is shown in FIGS. 15, 16A and 16B. FIG. 16A shows a scanning electron microscope (SEM) image of a regular hexagonal array. The inset of FIG. 16A shows a zoom-in area of any part of a unit-cell of the VCSEL array in SEM image at post-oxidation stage with clear oxide aperture diameters visible using SEM. All emitters in this array are arranged by satisfying the relation of VCSEL diameters (as defined above): D1>D3>D2 and the relation of pitch: P1=P2=P3. FIG. 16B shows 2D intensity map through near field pattern (NFP) imaging of a regular hexagonal array with all emitters lighted-up (i.e., lasing).

Figure 17:
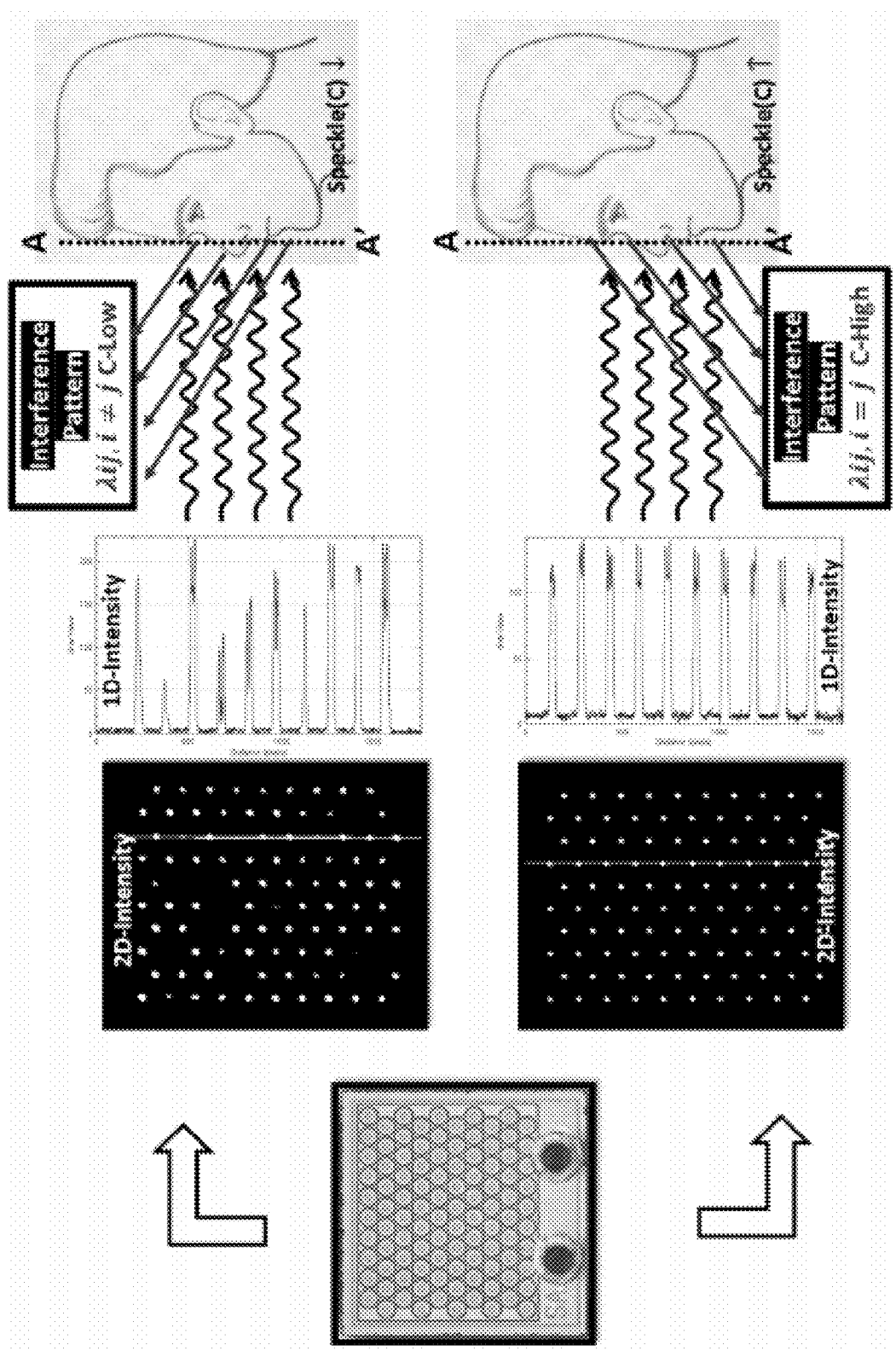
FIG. 17 shows 2D-intensity profile and 1D-intensity profile of a VCSEL array with partial or all emitters lasing in the presence of an interference of reflection of incident light from human facial drawing as 3D object. The left side of FIG. 17 shows an optical microscope image of fully processed 940 nm VCSEL array. The upper part of FIG. 17 shows the 2D-intensity profile of the VCSEL array in which some emitters not lasing, the 1D-intensity profile of the VCSEL array and the interference of reflection of incident light from human facial drawing as 3D object. The lower part of FIG. 17 shows the 2D-intensity profile of VCSEL array in with all emitters lasing, the 1D-intensity profile of the VCSEL array and the interference of reflection of incident light from human facial drawing as 3D object.

One of the aims of the disclosure is to claim a possible speckle reduction through VCSEL arrays when the arrays have no definite pitch among them. In this connection, a schematic of speckle formation in both regular (with P1=P2=P3) and random (P1≠P2≠P3) arrays are shown in FIG. 17. The left part of FIG. 17 shows an optical microscope image of the fully processed 940 nm VCSEL array with d1 >d3 >d2 and P1=P2=P3. Referring to the lower part of FIG. 17, this illustrates a standard case of uniform pitch among all emitters in the VCSEL array. When an incident light from this uniform pitched array falls on any 3D object, the interference pattern from reflected light shows increased speckle as the reflected rays lacks constant phase and amplitude due to depth differences of the 3D object. However, when an incident light from a non-uniform pitched array falls on any 3D object, the interference pattern from reflected light shows reduced speckle as the reflected rays emanated with constant phase due to multiple reflections from 3D object, which is likely to have constant phase and amplitude and thus can improve the image quality.

The upper part of FIG. 17 also shows a 2D-intensity profile of the VCSEL array with some emitters not lasing. This case with D1>D3>D2 and with absent emitters can be considered as a non-uniform P1≠P2≠P3 as random array for practical purposes, a 1D-intensity profile of the VCSEL array and the interference of reflected light from human facial drawing as 3D object are also shown in the lower part of FIG. 17. Here the 2D-VCSEL array has i rows and j columns with emission intensity from this array as $\lambda ij$. If all emitters have same Intensity ($\lambda i=j$). It leads to increase in speckle from out-of-phase reflections from 3D objects when all emitters intensity are different ($\lambda i \neq j$), and it leads to reduction of speckle from likely in-phase reflections from 3D objects.

The lower part of FIG. 17 shows a 2D-intensity profile of VCSEL array in 17(a) with all emitters lasing with D1>D3>D2 and pitch P1=P2=P3. A 1D-intensity profile of 2D-VCSEL array is also shown at the lower part of FIG. 17, which demonstrates a rather constant emission intensity and the interference of reflected light from human facial drawing as 3D object having increased speckle. In both cases above, the speckle contrast ratio may be reduced even with small differences of emission wavelengths of emitters 1D-scan lines. Thus, the positions or the pitch among emitters is important to affect the image quality through speckle-intensity noise.

The present disclosure provides the semiconductor laser device 10, which has a low speckle. The semiconductor laser device 10 of this disclosure has wide range of application, such as proximity sensing, gesture recognition, 3D sensing, time-of-flight sensing, lidar sensing, infrared sensing, etc. The present disclosure also provides the optical array 200 with a random array of the semiconductor laser device 10. The random array design is desirable in many fields of application. For example, when an image sensor is capturing the image of an irregularly shaped object, a regular array (i.e., with semiconductor laser devices periodically arranged) may suffer from unbalanced image since the number of sensors in each pixel is different due to the irregularity of the object. A random array, on the other hand, provides a more balanced image while capturing the irregularly shaped object.

While the principles of the disclosure have been illustrated in relation to the exemplary embodiments shown herein, the principles of the disclosure are not limited thereto and include any modification, variation or permutation thereof.

What is claimed is:

1. A vertical-cavity surface-emitting laser (VCSEL) device comprising:
   a substrate;
   a first-type doped distributed Bragg reflector disposed on said substrate;
   a first electrode connected to said substrate;
   an active layer disposed on said first-type doped distributed Bragg reflector;
   a second-type doped distributed Bragg reflector disposed on said active layer;
   a surface relief layer formed of a semiconductor material on a top surface of said second-type doped distributed Bragg reflector and having a surface relief indentation having a diameter;
   a confinement member formed in the second-type doped distributed Bragg reflector and located between said surface relief layer and said active layer, said confinement member defining an aperture having an aperture diameter and being adapted for a laser beam generated by said active layer to pass there through; and
   a second electrode disposed on said surface relief layer, said second electrode being a ring shaped p-contact metal having an inner diameter,
   wherein an upper portion of said first-type doped distributed Bragg reflector, said active layer and said second-type doped distributed Bragg reflector form a mesa structure that is tapered from said upper portion of said first-type doped distributed Bragg reflector to said second-type doped distributed Bragg reflector and that has a bottom mesa diameter;
   wherein said bottom mesa diameter of said mesa structure is larger than said inner diameter of said second electrode, said inner diameter of said second electrode is larger than said aperture diameter of said aperture, and said aperture diameter of said aperture is larger than said diameter of said surface relief indentation of said surface relief layer; and
   wherein said surface relief layer has a thickness that equals to n/4 times a wavelength of the laser beam with n being positive even numbers.

2. The VCSEL device as claimed in claim 1, wherein said confinement member is made of a semiconductor material implanted with ions selected from one of hydrogen ions, helium ions, oxygen ions, and combinations thereof, said semiconductor material being a AlGaAs/GaAs multilayer stack.

3. The VCSEL device as claimed in claim 2, wherein the semiconductor material is made of a wet oxidation of AlxGa1-xAs/GaAs multilayer stack with x=0.98-1.0.

4. The VCSEL device as claimed in claim 1, wherein said first electrode is located at the bottom of said substrate.

5. The VCSEL device as claimed in claim 1, wherein said active layer includes a quantum well layer that includes GaAs or $In_xGaAs$ quantum wells with x ranging from 0.02 to 0.35 and that has a thickness ranging from 2 nm to 12 nm.

6. The VCSEL device as claimed in claim 5, wherein said active layer further includes two barrier layers respectively connected to opposite sides of said quantum well layer, each of said barrier layers being made of $Al_xGa_{1-x}As$ with x ranging from 0 to 1.

7. The VCSEL device as claimed in claim 6, wherein said active layer further includes two separate confinement heterostructure layers that are respectively connected to said barrier layers on the opposite sides of said quantum well layer and that are made of $Al_xGa_{1-x}As$ with x ranging from 0 to 1.

8. The VCSEL device as claimed in claim 6, wherein said active layer further includes two separate confinement heterostructure layers that are respectively connected to said barrier layers on the opposite sides of said quantum well layer, each of said separate confinement heterostructure layers being a graded index separate confinement heterostructure layer made of $Al_xGaAs$ with x ranging from 0.15 to 0.75, each of said separate confinement heterostructure layers and having a thickness ranging from 4 nm to 120 nm.

9. The VCSEL device as claimed in claim 1, wherein said surface relief layer is a doped layer having a doping concentration higher than that of said second-type doped distributed Bragg reflector.

10. The VCSEL device as claimed in claim 1, wherein said substrate is one of n-type GaAs substrate and semi-insulating GaAs substrate.

11. An optical laser array, comprising a plurality of unit cells, each of said unit cells includes a first VCSEL device, a second VCSEL device and a third VCSEL device, each of said first, second and third VCSEL devices including:
    a substrate;
    a first-type doped distributed Bragg reflector disposed on said substrate;
    a first electrode connected to said substrate;
    an active layer disposed on said first-type doped distributed Bragg reflector;
    a second-type doped distributed Bragg reflector disposed on said active layer;
    a surface relief layer formed on a top surface of said second-type doped distributed Bragg reflector and having a surface relief indentation that has a diameter;
    a confinement member formed in the second-type doped distributed Bragg reflector and located between said surface relief layer and said active layer, said confinement member extending around an intermediate portion of said second-type doped distributed Bragg reflector to define an aperture having an aperture diameter and being adapted for a laser beam generated by said active layer to pass therethrough; and
    a second electrode disposed on said surface relief layer and having an inner diameter,
    wherein an upper portion of said first-type doped distributed Bragg reflector, said active layer and said second-type doped distributed Bragg reflector form a mesa structure that is tapered from said upper portion of said first-type doped distributed Bragg reflector to said second-type doped distributed Bragg reflector and that has a bottom mesa diameter;
    wherein said bottom mesa diameter of said mesa structure is larger than said aperture diameter of said aperture, said aperture diameter of said aperture is larger than said inner diameter of said second electrode, and said inner diameter of said second electrode is larger than a diameter of said surface relief indentation of said surface relief layer;
    wherein said surface relief layer has a thickness that equals to n/4 times a wavelength of the laser beam with n being positive even numbers; and
    wherein said mesa structures of said first, second and third VCSEL devices respectively have first, second and third bottom mesa diameters (D1, D2 and D3), center points of said first and second VCSEL devices being spaced apart from each other by a first distance, the center point of said first VCSEL device being spaced apart from a center point of said third VCSEL devices by a second distance, and the center point of said second VCSEL device being spaced apart from said third VCSEL devices by a third distance.

12. The optical laser array as claimed in claim 11, wherein said first, second and third bottom mesa diameters (D1, D2, D3) of said first, second and third VCSEL devices are different from each other, and said first, second and third distances are different from each other.

13. The optical laser array as claimed in claim 12, wherein said first distance ranges from 0.75*(D1+D2) to 1.5*(D1+D2), said second distance ranges from 0.75*(D1+D3) to 1.5*(D1+D3), and said third distance ranges from 0.75*(D2+D3) to 1.5*(D2+D3).

14. The optical laser array as claimed in claim 11, wherein said first, second and third bottom mesa diameters (D1, D2, D3) of said first, second and third VCSEL devices being the same, and said first, second and third distances being the same.

15. A method of manufacturing an optical sensor module having a random VCSEL array, the random VCSEL array having a plurality of VCSELs, each VCSEL comprising:
- a substrate;
- a first-type doped distributed Bragg reflector disposed on said substrate;
- a first electrode connected to said substrate;
- an active layer disposed on said first-type doped distributed Bragg reflector;
- a second-type doped distributed Bragg reflector disposed on said active layer;
- a surface relief layer formed on a top surface of said second-type doped distributed Bragg reflector and having a surface relief indentation having a diameter in the range of 1.0-6.0 µm;
- a confinement member formed in the second-type doped distributed Bragg reflector and located between said surface relief layer and said active layer, said confinement member extending around an intermediate portion of said second-type doped distributed Bragg reflector to define an aperture adapted for a laser beam generated by said active layer to pass therethrough with aperture diameter in the range of 3.0-15 µm; and
- a second electrode being a ring shaped p-Contact metal with inner diameter ranging from 8-17 µm and being disposed on said surface relief layer, wherein an upper portion of said first-type doped distributed Bragg reflector, said active layer and said second-type doped distributed Bragg reflector form a mesa structure having a bottom diameter ranging from 16-48 µm that is tapered from said upper portion of said first-type doped distributed Bragg reflector to said second-type doped distributed Bragg reflector, wherein said bottom mesa diameter of said mesa structure is larger than said aperture diameter of said aperture, said aperture diameter of said aperture is larger than said inner diameter of said second electrode, and said inner diameter of said second electrode is larger than said diameter of said surface relief indentation of said surface relief layer; and wherein said surface relief layer has a thickness that equals to n/4 times a wavelength of the laser beam with n being positive even integers.

16. An optical array comprising a plurality of VCSEL devices of claim 1, wherein said mesa structure of each of said VCSEL devices is one of cylindrical mesa, hexagonal mesa, and square mesa, said VCSEL devices being randomly arranged in a 2-D matrix, said VCSEL devices having emission wavelengths that are different from each other.

17. The VCSEL device as claimed in claim 1, wherein:
said diameter of said surface relief indentation ranges from 1.0 µm to 6.0 µm;
said aperture diameter of said aperture ranges from 2 µm to 6 µm;
said inner diameter of said second electrode ranges from 8 µm to 17 µm; and
said bottom mesa diameter of said mesa structure ranges from 16 µm to 48 µm.

18. The VCSEL device as claimed in claim 5, wherein said active layer further includes two barrier layers respectively connected to opposite sides of said quantum well layer, each of said barrier layers being made of one of AlxGa1-xAs with x ranging from 0.15 to 0.4, GaAs1-yPy with y ranging from 0.15 to 0.3 and GaAs.

19. The VCSEL device as claimed in claim 6, wherein said active layer further includes two separate confinement heterostructure layers that are respectively connected to said barrier layers on the opposite sides of said quantum well layer, each of said barrier layers being made of one of AlxGa1-xAs with x ranging from 0.15 to 0.4, GaAs1-yPy with y ranging from 0.15 to 0.3 and GaAs.

20. The VCSEL device as claimed in claim 1, wherein said confinement member extends around an intermediate portion of said second-type doped distributed Bragg reflector to define said aperture having the aperture diameter.

* * * * *